United States Patent
Nishii

(10) Patent No.: US 8,233,139 B2
(45) Date of Patent: Jul. 31, 2012

(54) IMMERSION SYSTEM, EXPOSURE APPARATUS, EXPOSING METHOD, AND DEVICE FABRICATING METHOD

(75) Inventor: Yasufumi Nishii, Kumagaya (JP)

(73) Assignee: Nikon Corporation, Tokyo (JP)

( * ) Notice: Subject to any disclaimer, the term of this patent is extended or adjusted under 35 U.S.C. 154(b) by 529 days.

(21) Appl. No.: 12/382,742

(22) Filed: Mar. 23, 2009

(65) Prior Publication Data
US 2009/0280436 A1    Nov. 12, 2009

Related U.S. Application Data

(60) Provisional application No. 61/064,810, filed on Mar. 27, 2008.

(51) Int. Cl.
*G03B 27/42* (2006.01)
*G03B 27/52* (2006.01)

(52) U.S. Cl. .......................... 355/53; 355/30
(58) Field of Classification Search ............... 355/30, 355/53; 250/548
See application file for complete search history.

(56) References Cited

U.S. PATENT DOCUMENTS

| | | | |
|---|---|---|---|
| 6,208,407 B1 | 3/2001 | Loopstra | |
| 6,262,796 B1 | 7/2001 | Loopstra et al. | |
| 6,341,007 B1 | 1/2002 | Nishi et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,023,610 B2 | 4/2006 | Ohtsuki et al. | |
| 7,053,983 B2 | 5/2006 | Tokita | |
| 7,292,313 B2 | 11/2007 | Poon et al. | |
| 7,394,522 B2 * | 7/2008 | Hasegawa et al. | 355/53 |
| 2006/0023182 A1 | 2/2006 | Novak et al. | |
| 2006/0038968 A1 | 2/2006 | Kemper et al. | |

(Continued)

FOREIGN PATENT DOCUMENTS

EP      1 477 856 A1     11/2004
(Continued)

OTHER PUBLICATIONS

Jul. 17, 2009 International Search Report in International Application No. PCT/JP2009/056843.

(Continued)

*Primary Examiner* — Hung Henry Nguyen
(74) *Attorney, Agent, or Firm* — Oliff & Berridge PLC

(57) ABSTRACT

An immersion system is used in an immersion exposure, wherein a substrate is exposed with an exposure light through an optical member and a liquid, and that fills an optical path of the exposure light between the optical member and the substrate with the liquid. The immersion system comprises: a first member, which is disposed around the optical path of the exposure light and has a first surface that faces in a first direction; a second member that has a liquid recovery port, which is disposed on the outer side of the first surface with respect to the optical path of the exposure light; a first drive apparatus that is capable of moving the first member parallel to the first direction; and a second drive apparatus that is capable of moving the second member parallel to the first direction independently of the first member; wherein, a space between the first surface and a front surface of an object can hold the liquid; and a liquid between the liquid recovery port and the front surface of the object is recovered via the liquid recovery port.

27 Claims, 11 Drawing Sheets

U.S. PATENT DOCUMENTS

| | | |
|---|---|---|
| 2006/0221315 A1 | 10/2006 | Beckers et al. |
| 2006/0250593 A1 | 11/2006 | Nishii |
| 2007/0046910 A1 | 3/2007 | Poon et al. |
| 2007/0081136 A1* | 4/2007 | Hara ................................ 355/53 |
| 2007/0110213 A1 | 5/2007 | Leenders et al. |
| 2007/0216889 A1 | 9/2007 | Nishii |
| 2007/0291241 A1 | 12/2007 | Sakai et al. |
| 2007/0296939 A1 | 12/2007 | Nishii |
| 2008/0002169 A1 | 1/2008 | Hasegawa et al. |
| 2008/0032234 A1 | 2/2008 | Mizutani |
| 2008/0233512 A1 | 9/2008 | Nishii et al. |
| 2009/0122282 A1 | 5/2009 | Nishii |

FOREIGN PATENT DOCUMENTS

| | | |
|---|---|---|
| EP | 1 768 169 A1 | 3/2007 |
| EP | 1 796 146 A1 | 6/2007 |
| WO | WO 01/35168 A1 | 5/2001 |
| WO | WO 2004/019128 A2 | 3/2004 |
| WO | WO 2005/119742 A1 | 12/2005 |

OTHER PUBLICATIONS

Jul. 17, 2009 Written Opinion in International Application No. PCT/JP2009/056843.

* cited by examiner

IMMERSION SYSTEM, EXPOSURE APPARATUS, EXPOSING METHOD, AND DEVICE FABRICATING METHOD

CROSS-REFERENCE TO RELATED APPLICATION

This application is a non-provisional application claiming priority to and the benefit of U.S. provisional application No. 61/064,810, filed Mar. 27, 2008. The entire contents of which are incorporated herein by reference.

BACKGROUND

1. Field of the Invention

The present invention relates to an immersion system, an exposure apparatus, an exposing method, and a device fabricating method.

2. Description of Related Art

As disclosed in U.S. Patent Application Publication No. 2006/0250593 and U.S. Patent Application Publication No. 2007/0296939, among exposure apparatuses used in photolithography, an immersion exposure apparatus is known that exposes a substrate with exposure light through a liquid.

In an immersion exposure apparatus, it is critical to satisfactorily fill the optical path of the exposure light between the substrate and an optical member, such as a projection optical system, with the liquid. If the optical path cannot be satisfactorily filled with the liquid, for example, if a gas portion, such as a bubble, occurs in the liquid, then exposure failures may occur; for example, defects may occur in the pattern formed in the substrate. In addition, if the substrate is moved at high speed in the state wherein the optical path between the substrate and, for example, the optical member is filled with the liquid, then it becomes difficult to satisfactorily and continuously fill the optical path with the liquid, and the liquid may leak out from a prescribed space, remain on the substrate, or the like. Furthermore, the heat of vaporization of the leaked or residual liquid may induce changes in the temperature of the optical path, thermal deformation in the various members, such as the substrate, or the like. In this case, too, exposure failures may occur. As a result, defective devices could be produced.

A purpose of some aspects of the present invention is to provide a liquid immersion system that can satisfactorily fill an optical path of exposure light with a liquid. Another purpose of the aspects of the present invention is to provide both an exposure apparatus that can prevent exposure failures and an exposing method. Yet another purpose of the aspects of the present invention is to provide a device fabricating method that can prevent the production of defective devices.

SUMMARY

A first aspect of the invention provides an immersion system used in an immersion exposure, comprising: a first member, which is disposed around an optical path of exposure light and has a first surface that faces in a first direction, the optical path between an optical member and a substrate being filled with a liquid, a space between the first surface and a front surface of an object being capable of holding a liquid; a second member that has a liquid recovery port, which is disposed on the outer side of the first surface with respect to the optical path of the exposure light, at least part of a liquid between the liquid recovery port and the front surface of the object being recovered via the liquid recovery port; a first drive apparatus that is capable of moving the first member in at least the first direction; and a second drive apparatus that is capable of moving the second member in at least the first direction independently of the first member.

A second aspect of the invention provides an immersion system used in an immersion exposure, comprising: a first member, which is disposed around an optical path of exposure light and has a first surface that faces in a first direction, the optical path between an optical member and a substrate being filled with a liquid, a space between the first surface and a front surface of an object being capable of holding a liquid; a second member that has a liquid recovery port, which is disposed on the outer side of the first surface with respect to the optical path of the exposure light, at least part of a liquid between the liquid recovery port and the front surface of the object being recovered via the liquid recovery port; and a drive apparatus that is capable of controlling a relative movement between a first member and a second member in at least the first direction; wherein, the liquid recovery port has a first recovery area and a second recovery area, which is disposed on the outer side of the first surface with respect to the optical path of the exposure light, a distance between a front surface of the object and the first recovery area in the first direction is greater than a distance between the front surface of the object and the second recovery area in the first direction, and a positional relationship between the first recovery area and the first surface in the first direction can be adjusted.

A third aspect of the invention provides an exposure apparatus that exposes a substrate with exposure light through a liquid, comprising: an immersion system according to the first and second aspects.

A fourth aspect of the invention provides a device fabricating method, comprising: exposing a substrate using an exposure apparatus according to the third aspect; and developing the exposed substrate.

A fifth aspect of the invention provides an exposing method that exposes a substrate with exposure light through a liquid, comprising: filling an optical path of the exposure light between the optical member and the substrate with the liquid using an immersion system according to the first and second aspects; and radiating the exposure light to the substrate through the optical member and the liquid.

A sixth aspect of the invention provides a device fabricating method, comprising: exposing a substrate using an exposing method according to the fourth aspect; and developing the exposed substrate.

According to some aspects of the present invention, an optical path of exposure light can be satisfactorily filled with a liquid and thereby prevent exposure failures from occurring and defective devices from being produced.

DESCRIPTION OF EMBODIMENTS

The following text explains the embodiments of the present invention referencing the drawings, but the present invention is not limited thereto. The explanation below defines an XYZ orthogonal coordinate system, and the positional relationships among members are explained referencing this system. Prescribed directions within the horizontal plane are the X axial directions, directions orthogonal to the X axial directions in the horizontal plane are the Y axial directions, and directions orthogonal to the X axial directions and the Y axial directions (i.e., the vertical directions) are the Z axial directions. In addition, the rotational (inclination) directions around the X, Y, and Z axes are the θX, θY, and θZ directions, respectively.

Figure 1:
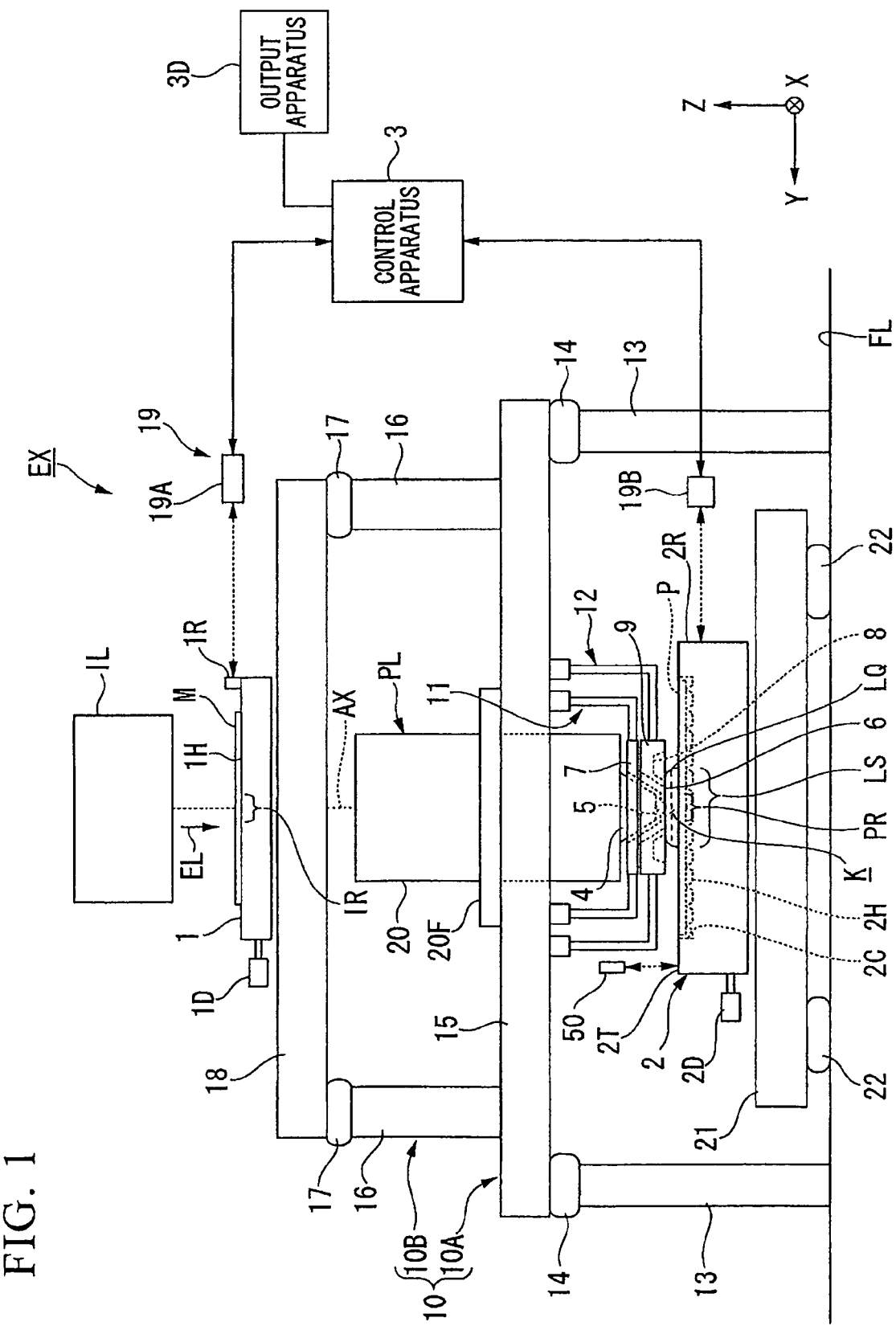
FIG. 1 is a schematic block diagram that shows one example of an exposure apparatus according to the present embodiment.

FIG. 1 is a schematic block diagram that shows one example of an exposure apparatus EX according to the present embodiment. In FIG. 1, the exposure apparatus EX comprises: a movable mask stage 1, which holds a mask M; a movable substrate stage 2, which holds a substrate P; an illumination system IL, which illuminates the mask M with exposure light EL; a projection optical system PL, which projects onto the substrate P an image of a pattern of the mask M illuminated by the exposure light EL; and a control apparatus 3, which controls the operation of the entire exposure apparatus EX. In addition, the exposure apparatus EX comprises an output apparatus 3D, which is connected to the control apparatus 3 and is capable of outputting, for example, the operation status of the exposure apparatus EX. The output apparatus 3D comprises at least one of the following: a display apparatus, such as a flat panel display; a light generating apparatus that emits light; and a sound generating apparatus that emits sound (including alarms).

The mask M may be, for example, a reticle wherein a device pattern is formed that is projected onto the substrate P. The mask M can be, for example, a light transmissive mask wherein a light shielding film made of chrome and the like is used to form a prescribed pattern on a transparent plate, such as a glass plate. Furthermore, the mask M can alternatively be a reflective mask. The substrate P is a substrate for fabricating devices. The substrate P comprises a base material (e.g., a semiconductor wafer, such as a silicon wafer) and a photosensitive film that is formed thereon. The photosensitive film is made of a photosensitive material (photoresist). In addition to the photosensitive film, the substrate P can include a separate film. For example, the substrate P can include an antireflective film, a protective film (topcoat film) that protects the photosensitive film, and the like.

In the present embodiment, the exposure apparatus EX is an immersion exposure apparatus that exposes the substrate P with the exposure light EL that passes through a liquid LQ. In the present embodiment, an immersion space LS is formed so that at least part of the optical path of the exposure light EL is filled with the liquid LQ. The immersion space LS is a space that is filled with the liquid LQ. In the present embodiment, water (pure water) is used as the liquid LQ.

In the present embodiment, the immersion space LS is formed so that an optical path K of the exposure light EL that emerges from a last optical element 4, which is the optical element of a plurality of optical elements of the projection optical system PL closest to the image plane thereof, is filled with the liquid LQ. The last optical element 4 has an emergent surface 5 that emits the exposure light EL toward the image plane of the projection optical system PL. The immersion space LS is formed so that the optical path K between the last optical element 4 and an object disposed at a position at which it opposes the emergent surface 5 of the last optical element 4 is filled with the liquid LQ. The position at which the object opposes the emergent surface 5 includes an irradiation position of the exposure light EL that emerges from the emergent surface 5. In the explanation below, the position at which the object opposes the emergent surface 5 of the last optical element 4 is called an exposure position, where appropriate.

The exposure apparatus EX comprises an immersion system for filling, with the liquid LQ, the optical path K between the last optical element 4 and the object disposed at a position at which it opposes the emergent surface 5 of the last optical element 4. The immersion system comprises: a first member 7, which is disposed around the optical path K of the exposure light EL emitted from the emergent surface 5, that has a lower surface 6, which is capable of holding the liquid LQ between itself and the front surface of the object disposed at the exposure position; a second member 9, which is disposed around the outer side of the lower surface 6 with respect to the optical path K of the exposure light EL, that has a liquid recovery port 8, which is capable of recovering the liquid LQ on the front surface of the object; a first drive apparatus 11, which is capable of moving the first member 7; and a second drive apparatus 12, which is capable of moving the second member 9 independently of the first member 7.

The first member 7 is disposed in the vicinity of the last optical element 4. In the present embodiment, the object capable of opposing the emergent surface 5 is also capable of opposing the lower surface 6. When the front surface of the object is disposed at a position at which it opposes the emergent surface 5, at least part of the lower surface 6 and the front surface of the object are opposed. When the emergent surface 5 and the front surface of the object are opposed, the space therebetween can hold the liquid LQ. In addition, when the lower surface 6 and the front surface of the object are opposed, the space therebetween can hold the liquid LQ. Holding the liquid LQ between the emergent surface 5 and the lower surface 6 on one side and the front surface of the object on the other side forms the immersion space LS so that the optical path K of the exposure light EL between the emergent surface 5 of the last optical element 4 and the front surface of the object is filled with the liquid LQ.

In the present embodiment, the emergent surface 5 faces in the −Z direction. The lower surface 6 faces in the −Z direction. At least part of the liquid recovery port 8 faces in the −Z direction. At least part of the front surface of the object, which is capable of opposing the emergent surface 5 and the lower surface 6 and of holding the liquid LQ between itself and the emergent surface 5 and the lower surface 6, faces in the +Z direction.

In the present embodiment, the object, which is capable of opposing the emergent surface 5 and the lower surface 6, can include an object that is capable of moving on the emergent side (the image plane side) of the last optical element 4 and an object that is capable of moving within a prescribed surface that includes the exposure position. In the present embodiment, the object includes either the substrate stage 2 or the substrate P, which is held by the substrate stage 2, or both. Furthermore, to simplify the explanation, the following text principally explains an exemplary state wherein the substrate P opposes the emergent surface 5 of the last optical element 4.

The exposure apparatus EX comprises a body 10 that comprises: a first column 10A, which is provided on a support surface FL inside, for example, a clean room; and a second column 10B, which is provided on the first column 10A. The first column 10A comprises: a plurality of first support posts 13; and a first base plate 15, which is supported by the first support posts 13 via vibration isolating apparatuses 14. The second column 10B comprises: a plurality of second support posts 16, which are provided on the first base plate 15, and a second base plate 18, which is supported by the second support posts 16 via vibration isolating apparatuses 17.

The illumination system IL illuminates a prescribed illumination region IR with the exposure light EL, which has a uniform luminous flux intensity distribution. The illumination system IL illuminates at least part of the mask M disposed in the illumination region IR with the exposure light EL, which has a uniform luminous flux intensity distribution. Examples of light that can be used as the exposure light EL emitted from the illumination system IL include: deep ultraviolet (DUV) light such as a bright line (g-line, h-line, or i-line) light emitted from, for example, a mercury lamp and KrF excimer laser light (with a wavelength of 248 nm); and vacuum ultraviolet (VUV) light such as ArF excimer laser light (with a wavelength of 193 nm) and $F_2$ laser light (with a wavelength of 157 nm). In the present embodiment, ArF excimer laser light, which is ultraviolet light (vacuum ultraviolet light), is used as the exposure light EL.

The mask stage 1 comprises a mask holding part 1H that releasably holds the mask M. In the present embodiment, the mask holding part 1H holds the mask M so that a patterned surface (lower surface) of the mask M is substantially parallel to the XY plane. The mask stage 1, in the state wherein it holds the mask M, is capable of moving, by the operation of a first drive system 1D that includes actuators (e.g., linear motors), along an upper surface (a guide surface) of the second base plate 18 within an XY plane that includes the illumination region IR. The upper surface of the second base plate 18 is substantially parallel to the XY plane. In the present embodiment, in the state wherein the mask M is held by the mask holding part 1H, the mask stage 1 is capable of moving in three directions: the X axial, Y axial, and θZ directions.

A laser interferometer 19A of the interferometer system 19 measures the position of the mask stage 1 (mask M). The laser interferometer 19A measures the position using a reflecting mirror 1R, which is provided to the mask stage 1. Based on the measurement result of the laser interferometer 19A, the control apparatus 3 controls the position of the mask M, which is held by the mask stage 1, by operating the first drive system 1D.

The projection optical system PL radiates the exposure light EL to a prescribed projection region PR. The projection optical system PL projects with a prescribed projection magnification an image of the pattern of the mask M to at least part of the substrate P, which is disposed in the projection region PR. A lens barrel 20 holds the plurality of optical elements of the projection optical system PL. The lens barrel 20 has a flange 20F. The projection optical system PL is supported by the first base plate 15 via the flange 20F. The position of the projection optical system PL, which is supported by the first base plate 15 and comprises the last optical element 4, is substantially fixed. Furthermore, a vibration isolating apparatus can be provided between the first base plate 15 and the lens barrel 20. The projection optical system PL of the present embodiment is a reduction system that has a projection magnification of, for example, ¼, ⅕, or ⅛. Furthermore, the projection optical system PL may also be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The substrate stage 2 comprises a substrate holding part 2H, which releasably holds the substrate P. In the present embodiment, the substrate holding part 2H holds the substrate P so that the front surface (exposure surface) of the substrate P is substantially parallel to the XY plane. The substrate stage 2, in the state wherein it holds the substrate P, is capable of moving, by the operation of a second drive system 2D that comprises actuators (e.g., linear motors), along an upper surface (a guide surface) of a third base plate 21 within an XY plane that includes the projection region PR. The third base plate 21 is supported by the support surface FL via vibration isolating apparatuses 22. The upper surface of the third base plate 21 is substantially parallel to the XY plane. In the present embodiment, in the state wherein the substrate P is held by the substrate holding part 2H, the substrate stage 2 is capable of moving in six directions: the X, Y, and Z axial directions, and the θX, θY, and θZ directions.

The substrate stage 2 has an upper surface 2T, which is disposed around the substrate holding part 2H and is capable of opposing the emergent surface 5 of the last optical element 4. The substrate holding part 2H is disposed in a recessed part 2C, which is provided in the substrate stage 2. The front surface of the substrate P held by the substrate holding part 2H is capable of opposing the emergent surface 5 of the last optical element 4. The upper surface 2T of the substrate stage 2 is a flat surface that is substantially parallel to the XY plane. The front surface of the substrate P, which is held by the substrate holding part 2H, and the upper surface 2T of the substrate stage 2 are disposed in substantially the same plane (i.e., they are substantially flush with one another).

A Laser interferometer 19B of the interferometer system 19 measures the position of the substrate stage 2 (the substrate P) in the X axial, Y axial, and θZ directions. The laser interferometer 19B measures the position of the substrate stage 2 using a reflecting mirror 2R, which is provided to the substrate stage 2. In addition, a detection system 50 detects the position (in the Z axial, θX, and θY directions) of a front surface of the substrate P held by the substrate stage 2. Based on the measurement result of the laser interferometer 19B and the detection results of the detection system 50, the control apparatus 3 controls the position of the substrate P held by the substrate stage 2 by operating the second drive system 2D.

In the present embodiment, the detection system 50 is capable of detecting the height (position in the Z axial directions) of the front surface of the substrate P or the upper surface 2T of the substrate stage 2, or both, at a plurality of detection points. The detection system 50 can detect not only the front surface of the substrate P and the upper surface 2T of the substrate stage 2, but also the position of the front surface of the object. Furthermore, various sensors can be employed in the detection system 50. For example, detection light may be radiated to the front surface of the substrate P or the upper surface 2T of the substrate stage 2, or to both, and an optical sensor that receives the reflected light thereof may be employed; alternatively, a capacitance sensor may be employed.

In the present embodiment, the exposure apparatus EX is a scanning type exposure apparatus (a so-called scanning stepper) that projects the image of the pattern of the mask M to the substrate P while synchronously moving the mask M and the substrate P in prescribed scanning directions. When the substrate P is to be exposed, the control apparatus 3 controls the mask stage 1 and the substrate stage 2 so as to move the mask M and the substrate P, respectively, in the prescribed scanning directions within the XY plane, which is orthogonal to the optical axis AX (i.e., the optical path K of the exposure light EL). In the present embodiment, the scanning directions (the synchronous movement directions) of both the substrate P and the mask M are the Y axial directions. The control apparatus 3 moves the substrate P in one of the Y axial directions with respect to the projection region PR of the projection optical system PL and radiates the exposure light EL to the substrate P through the projection optical system PL and the liquid LQ in the immersion space LS on the substrate P while moving, synchronized to the movement of the substrate P, the mask M in the other Y axial direction with respect to the illumination region IR of the illumination system IL. Thereby, the image of the pattern of the mask M is projected to the substrate P, which is thereby exposed by the exposure light EL.

Figure 2:
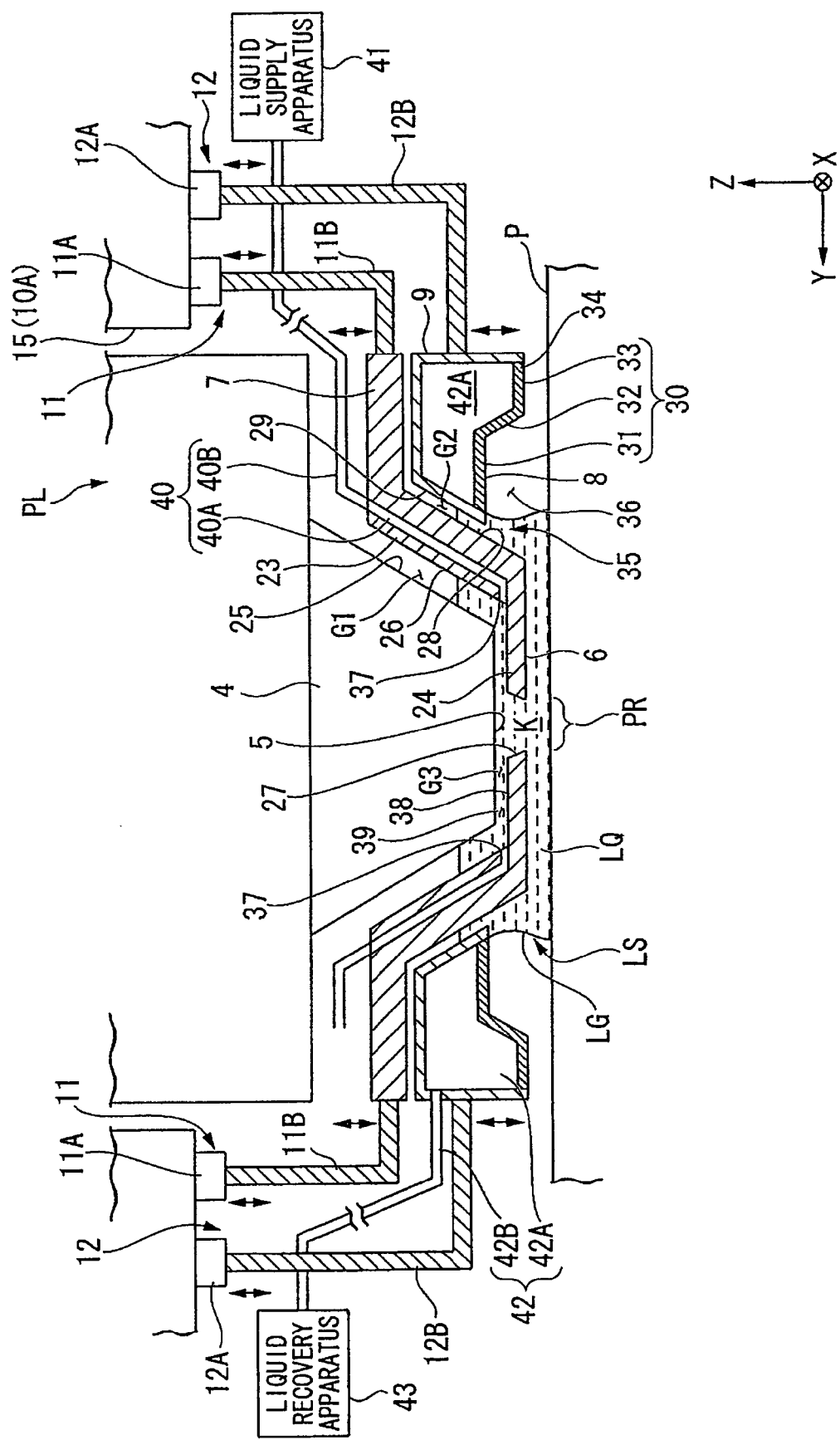
FIG. 2 is a side cross sectional view that shows the vicinity of a first member and a second member according to the present embodiment.
Figure 3:
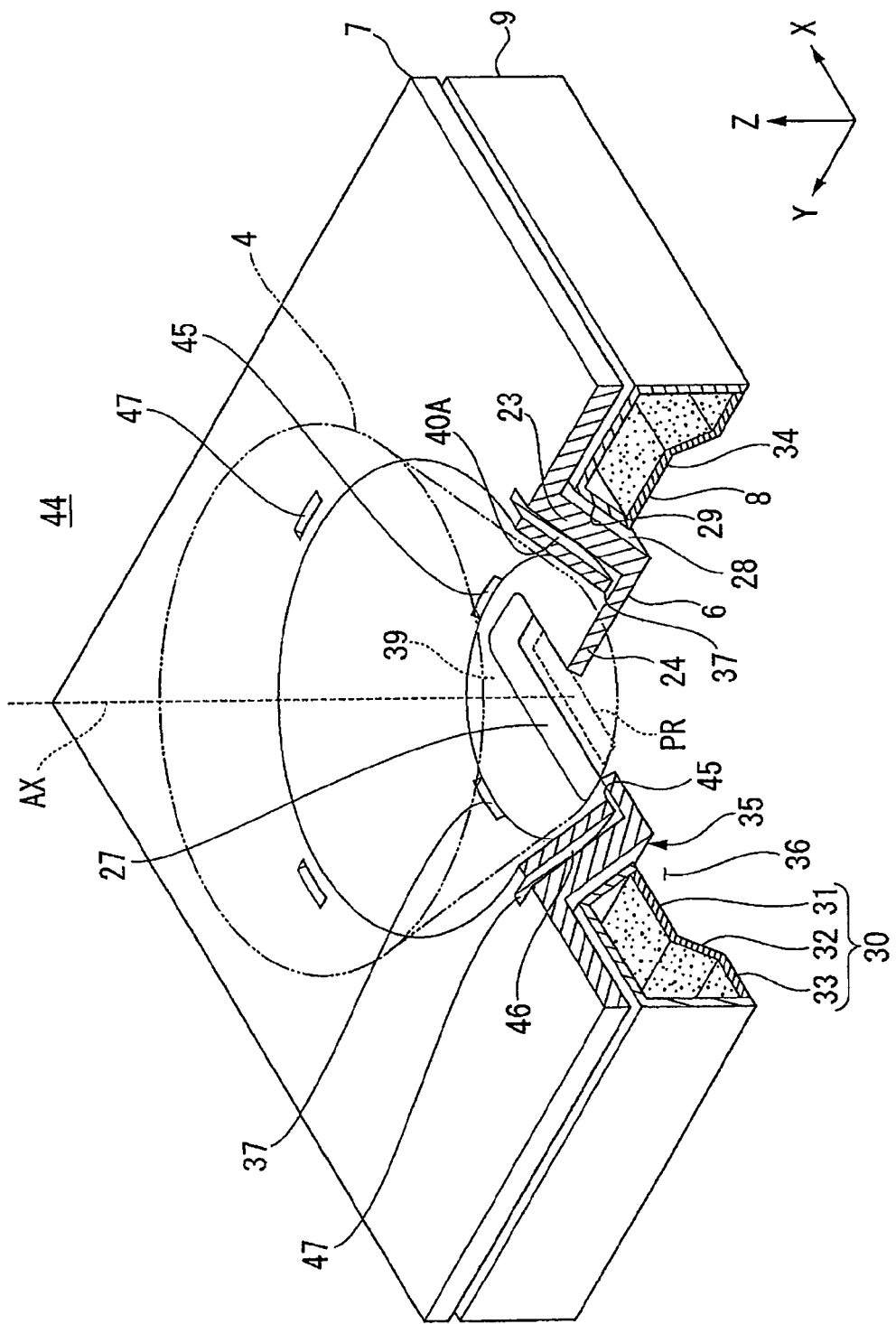
FIG. 3 is a partial, broken, schematic oblique view of the first member and the second member according to the present embodiment.
Figure 4:
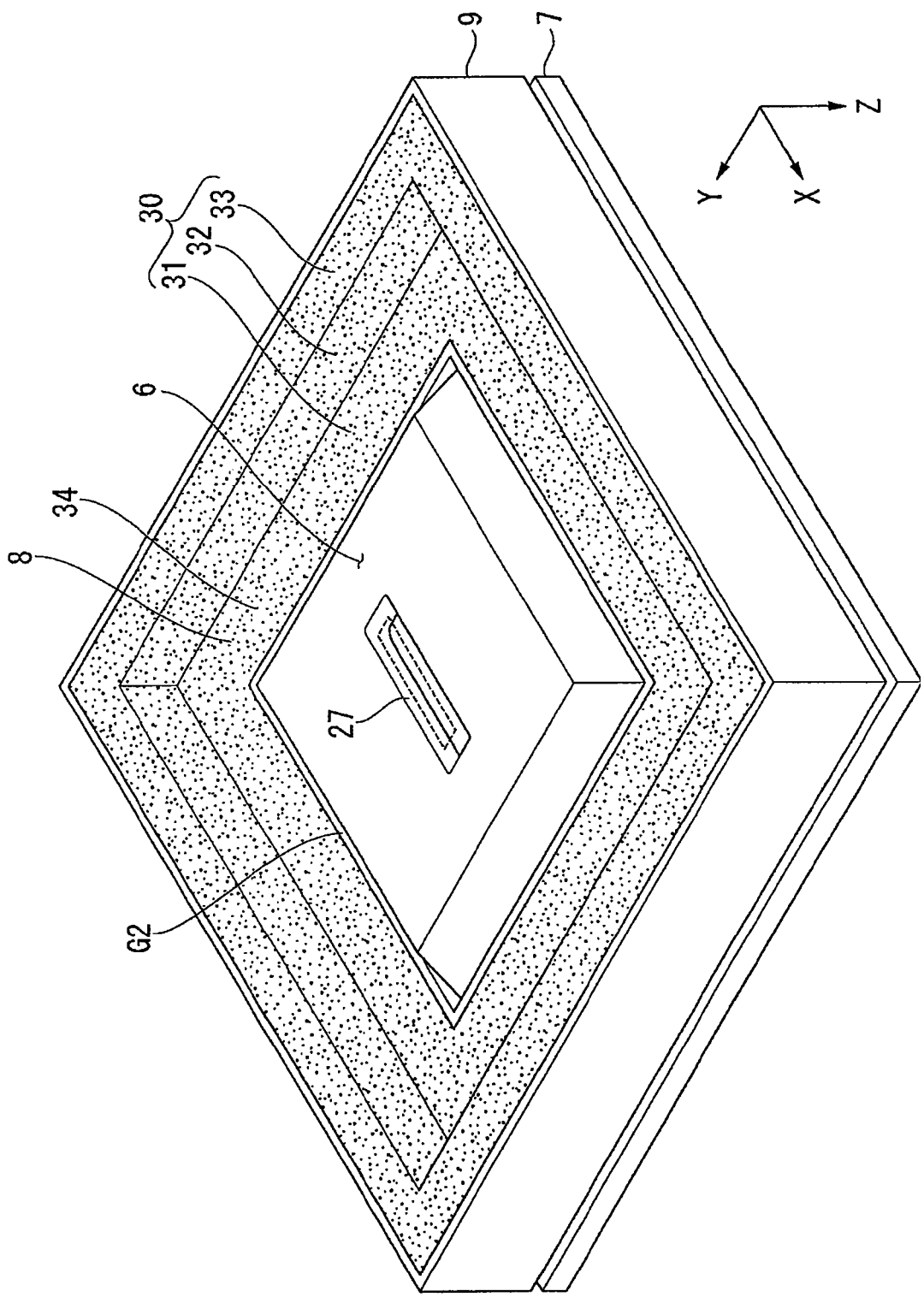
FIG. 4 is an oblique view of the first member and the second member according to the present embodiment, viewed from the lower side.
Figure 5:
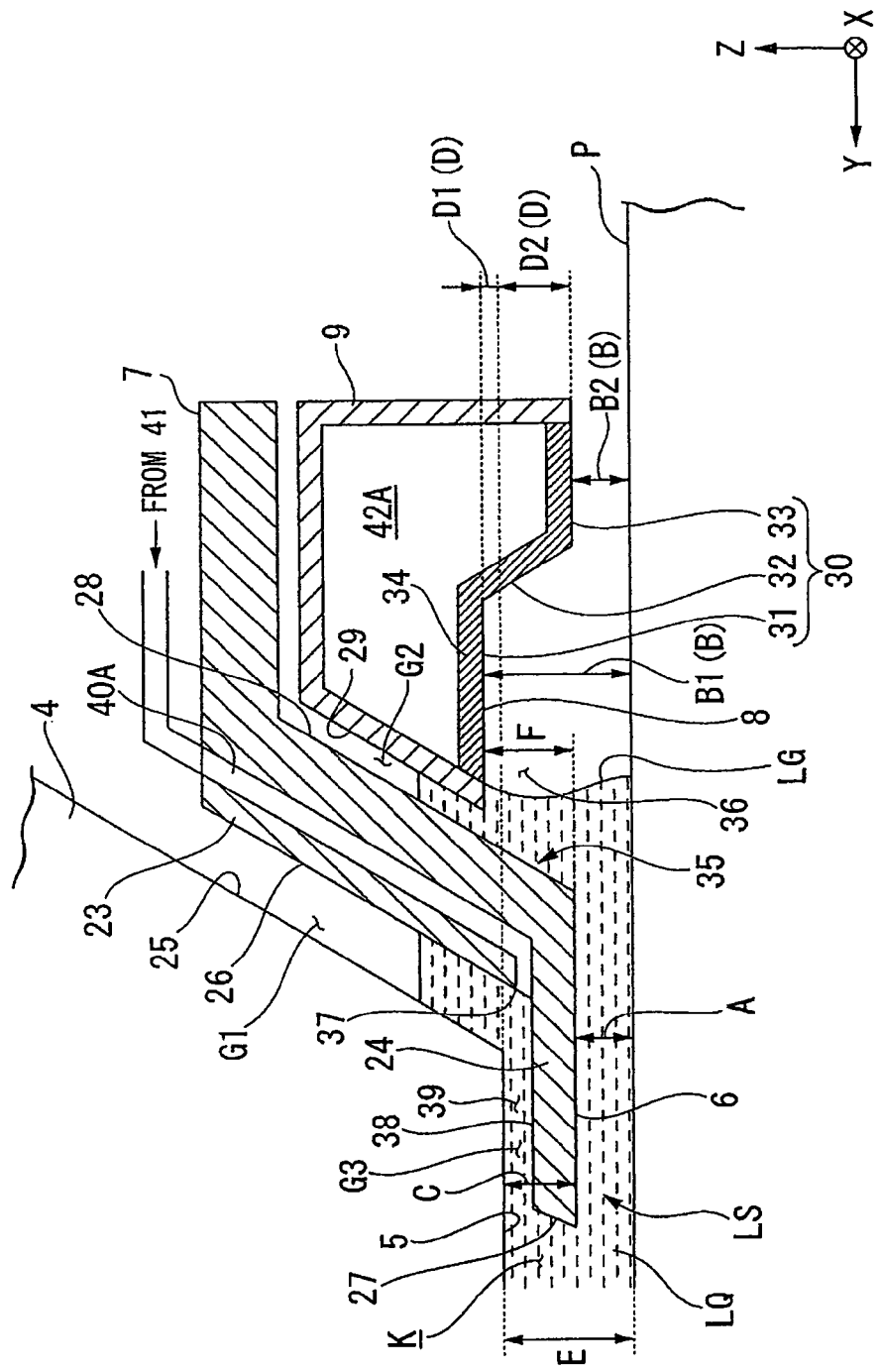
FIG. 5 is a partial, enlarged, side cross sectional view of the first member and the second member according to the present embodiment.

The first member 7 and the second member 9 of the liquid immersion system will now be explained, referencing FIG. 2 through FIG. 5. FIG. 2 is a side cross sectional view that shows the vicinity of the first member 7 and the second member 9; FIG. 3 is a schematic, oblique, partial, broken view that shows the first member 7 and the second member 9; FIG. 4 is an oblique view, viewed from the lower side, of the first member 7 and the second member 9; and FIG. 5 is a partial, enlarged, side cross sectional view of the first member 7 and the second member 9.

Furthermore, the following text explains an exemplary case wherein the substrate P is disposed at a position at which it opposes the emergent surface 5 of the last optical element 4; however, as discussed above, it is also possible to dispose an object other than the substrate P, such as the substrate stage 2, at a position at which it opposes the emergent surface 5 of the last optical element 4.

The first member 7 is a rectangular annular member (rectangular ring shaped member). The first member 7 is disposed around the optical path K of the exposure light EL. In the present embodiment, the first member 7 comprises a side plate part 23, which is disposed around the last optical element 4, and a lower plate part 24, at least part of which is disposed between the emergent surface 5 of the last optical element 4 and the front surface of the substrate P in the Z axial directions.

The side plate part 23 opposes an outer circumferential surface 25 of the last optical element 4 and has an inner circumferential surface 26 that is formed along that outer circumferential surface 25. The inner circumferential surface 26 of the first member 7 is disposed so that it opposes the outer circumferential surface 25 of the last optical element 4 with a prescribed gap G1 interposed therebetween. In addition, the outer circumferential surface 25 and the inner circumferential surface 26 are inclined upward in a radial direction with respect to the optical axis AX (i.e., the optical path K of the exposure light EL). Namely, the outer circumferential surface 25 and the inner circumferential surface 26 are each provided so that its distance from the front surface of the substrate P gradually increases as it becomes more spaced apart from the optical axis AX. The outer circumferential surface 25 and the inner circumferential surface have each an upward and outward inclination. In the present embodiment, the size of the gap G1 is such that at least part of the liquid LQ of the immersion space LS can flow into the gap G1. The outer circumferential surface 25 and the inner circumferential surface 26 may be parallel to the optical axis AX.

The lower plate part 24 has an opening 27 at its center. The exposure light EL that emerges from the emergent surface 5 of the last optical element 4 can pass through the opening 27. For example, during an exposure of the substrate P, the exposure light EL that emerges from the emergent surface 5 of the last optical element 4 passes through the opening 27 and is radiated to the front surface of the substrate P through the liquid LQ. In the present embodiment, the cross sectional shape of the exposure light EL in the opening 27 is substantially rectangular (slit shaped) with the longitudinal directions in the X axial directions. In accordance with the cross sectional shape of the exposure light EL, the opening 27 is formed in a substantially rectangular shape (a slit shape) in the X and Y directions. In addition, the cross sectional shape of the exposure light EL in the opening 27 and the shape of the projection region PR of the projection optical system PL on the substrate P are substantially similar.

The first member 7 has a lower surface 6, which is disposed around the optical path K of the exposure light EL and faces in the −Z direction. The lower surface 6 is disposed so that it opposes the front surface of the substrate P. The lower surface 6 is capable of holding the liquid LQ between itself and the front surface of the substrate P. In the present embodiment, the lower surface 6 is flat and substantially parallel to the front surface of the substrate P (the XY plane). In the present embodiment, the external shape of the lower surface 6 within the XY plane is rectangular. In the present embodiment, the lower surface 6 may be inclined with respect to the XY plane, may be a curved surface, or the like.

In the present embodiment, the lower surface 6 includes the lower surface of the lower plate part 24. The lower surface 6 is disposed around the opening 27. When the substrate P is disposed at a position at which it opposes the lower surface 6 of the first member 7, the first member 7 can hold the liquid LQ between at least the lower surface 6 and the front surface of the substrate P.

The second member 9 is a rectangular annular member. The second member 9 is disposed around the optical path K of the exposure light EL. In the present embodiment, the second member 9 is disposed around the first member 7. The second member 9 has an inner circumferential surface 29, which opposes part of an outer circumferential surface 28 of the first member 7 and is formed along that outer circumferential surface 28. A gap G2 is formed between the inner circumferential surface 29 of the second member 9 and the outer circumferential surface 28 of the first member 7. In addition, the outer circumferential surface 28 and the inner circumferential surface 29 are each inclined upward in a radial direction with respect to the optical axis AX (i.e., the optical path K of the exposure light EL). Namely, the outer circumferential surface 28 and the inner circumferential surface 29 are each provided so that its distance from the front surface of the substrate P gradually increases as it becomes more spaced apart from the optical axis AX. The outer circumferential surface 28 and the inner circumferential surface 29 have each an upward and outward inclination. In the present embodiment, the size of the gap G2 is such that at least part of the liquid LQ of the immersion space LS can flow into the gap G2. Furthermore, the size of the gap G2 may be such that the penetration of the liquid LQ into the immersion space LS owing to the surface tension of the liquid LQ is prevented. The outer circumferential surface 28 and the inner circumferential surface 29 may be parallel to the optical axis AX.

The second member 9 has a liquid recovery port 8, which is disposed on the outer side of the lower surface 6 with respect to the optical path K of the exposure light EL, at least part of which faces in the −Z direction. In FIG. 5, the liquid recovery port 8 opposes the front surface of the substrate P. In the present embodiment, the liquid recovery port 8 is disposed around the optical path K of the exposure light EL. The liquid recovery port 8 is capable of recovering the liquid LQ that is on the substrate P. At least part of the liquid LQ between the liquid recovery port 8 and the front surface of the substrate P opposed thereto is recovered via the liquid recovery port 8.

In the present embodiment, the liquid recovery port 8 has a liquid recovery surface 30, at least part of which faces in the −Z direction. In the present embodiment, a porous member 34 is disposed in the liquid recovery port 8, and the front surface of the porous member 34 forms the liquid recovery surface 30. The liquid immersion surface 30 is disposed around the optical path K of the exposure light EL. In the present embodiment, the porous member 34 is a plate shaped member, and the liquid recovery surface 30 is formed from one porous member 34 (a single sheet thereof). In the present embodiment, the porous member 34 has bent portions. Furthermore, in the present embodiment, the porous member 34 is one wherein a plurality of holes (through holes) are formed in a plate; however, a sintered member (e.g., sintered metal) wherein a plurality of holes (pores) are formed, a foam member (e.g., metal foam), or the like can also be used as the porous member 34.

The liquid recovery surface 30 is disposed on the outer sides of the lower surface 6 with respect to the optical path K of the exposure light EL. The liquid recovery surface 30 is capable of recovering the liquid LQ between the liquid immersion member 30 and the front surface of the substrate P. At least part of the liquid LQ between the liquid recovery surface 30 (i.e., the liquid recovery port 8) and the front surface of the substrate P, which opposes the liquid recovery surface 30, is recovered via the porous member 34. The liquid recovery surface 30 is capable of recovering the liquid LQ that contacts the recovery surface 30 (i.e., at the front surface of the porous member 34).

The liquid recovery surface 30 has: a first liquid recovery surface 31, which is disposed around the lower surface 6 and faces in the −Z direction; a second liquid recovery surface 32, which is disposed around the first liquid recovery surface 31 and faces in a direction other than the −Z direction; and a third liquid recovery surface 33, which is disposed around the second liquid recovery surface 32 and faces in the −Z direction. The first, second, and third liquid recovery surfaces 31, 32, 33 each include the front surface of the porous member 34. Furthermore, an area between the first liquid recovery surface 31 and the third liquid recovery surface 33 (i.e., the area wherein the second liquid recovery surface 32 is formed) may serve as a non-liquid recovery surface that does not recover the liquid LQ.

In the present embodiment, the first liquid recovery surface 31 and the third liquid recovery surface 33 are substantially parallel to the lower surface 6. Namely, the first liquid recovery surface 31 and the third liquid recovery surface 33 are substantially parallel to the front surface of the substrate P (the XY plane). In addition, as shown in FIG. 5, in the present embodiment, a distance B1 between the first liquid recovery surface 31 and the front surface of the substrate P in the Z axial directions is larger than a distance B2 between the third liquid recovery surface 33 and the front surface of the substrate P in the Z axial directions. In addition, in the present embodiment, the second liquid recovery surface 32 is inclined downward in radial directions with respect to the optical axis AX (i.e., the optical path K of the exposure light EL). Namely, the second liquid recovery surface 32 is provided so that the spacing between it and the front surface of the substrate P becomes gradually smaller as the second liquid recovery surface 32 becomes more spaced apart from the optical axis AX. The second liquid recovery surface 32 has an outward declination (downward and outward inclination). In addition, a distance A between the lower surface 6 and the front surface of the substrate P is smaller than a distance E between the emergent surface 5 and the front surface of the substrate P.

In FIG. 5, the distance A between the lower surface 6 and the front surface of the substrate P in the Z axial directions is smaller than the distance B1 between the first liquid recovery surface 31 and the front surface of the substrate P in the Z axial directions. Thus, if the first liquid recovery surface 31 is spaced apart from the lower surface 6 with respect to the front surface of the substrate P, then a step 35 is formed between the lower surface 6 and the first liquid recovery surface 31. The step 35 is formed on the outer sides of the first member 7 with respect to the optical path K of the exposure light EL. Accordingly, a recessed part 36, which is recessed in the +Z direction with respect to the front surface of the substrate P, is formed on the outer sides of the lower surface 6 with respect to the optical path K of the exposure light EL. The recessed part 36 is defined by part of the outer circumferential surface 28, the first liquid recovery surface 31, and the second liquid recovery surface 32.

The first drive apparatus 11 is capable of driving the first member 7 parallel to (or along or in) at least the Z axial directions. In the embodiment, along with the movement of the first member 7 in the Z axial directions, the lower surface 6 of the first member 7 moves in the Z axial directions. In another embodiment, the lower surface 6 of the first member 7 can move in the Z axial directions, along with a movement of the first member 7 in other than the Z axial directions, along with a substantially rotation of the first member 7, or along with a deformation of the first member 7. As shown in FIG. 2, in the present embodiment, the first drive apparatus 11 comprises: drive mechanisms 11A, which are disposed on the first base plate 15 (the first column 10A), that comprise actuators, for example, voice coil motors; and connecting members 11B, each of which connects its corresponding drive mechanism 11A to the first member 7. The control apparatus 3 is capable of moving the first member 7, which is connected to the connecting members 11B, in both the +Z and −Z directions by operating the drive mechanisms 11A.

The second drive apparatus 12 is capable of driving the second member 9 parallel to (or along or in) at least the Z axial directions independently of the first member 7. In the embodiment, along with the movement of the second member 9 in the Z axial directions, the liquid recovery port 8 (i.e., the liquid recovery surface 30) moves in the Z axial directions. In another embodiment, the liquid recovery port 8 (i.e., the liquid recovery surface 30) can move in the Z axial directions, along with a movement of the second member 9 in other than the Z axial directions, along with a substantially rotation of the second member 9, or along with a deformation of the second member 9. In the present embodiment, the second drive apparatus 12 comprises: a drive mechanism 12A, which is disposed in the first base plate 15 (the first column 10A), that comprises actuators, such as voice coil motors; and a connecting member 12B that connects the drive mechanism 12A and the second member 9. The control apparatus 3 is capable of moving the second member 9, which is connected to the connecting member 12B, in both the +Z and −Z directions by operating the drive mechanism 12A.

The control apparatus 3 is capable of controlling the first drive apparatus 11 and the second drive apparatus 12. The control apparatus 3 can move the lower surface 6 and the liquid recovery port 8 (i.e., the liquid recovery surface 30) relative to one another in the Z axial directions by operating at least one of the following: the first drive apparatus 11 and the second drive apparatus 12.

The control apparatus 3 can adjust the positional relationship between the lower surface 6 and the front surface of the substrate P in the Z axial directions by operating the first drive apparatus 11 and can adjust the positional relationship between the liquid recovery port 8 (i.e., the liquid recovery surface 30) and the front surface of the substrate P in the Z axial directions by operating the second drive apparatus 12. The adjustment of the positional relationship between the lower surface 6 and the front surface of the substrate P in the Z axial directions includes the adjustment of the distance A between the lower surface 6 and the front surface of the substrate P in the Z axial directions. In addition, the adjustment of the positional relationship between the liquid recovery port 8 (i.e., the liquid recovery surface 30) and the front surface of the substrate P in the Z axial directions includes the adjustment of a distance B between the liquid recovery port 8 (i.e., the liquid recovery surface 30) and the front surface of the substrate P in the Z axial directions. The adjustment of the distance B between the liquid recovery port 8 (i.e., the liquid recovery surface 30) and the front surface of the substrate P in the Z axial directions includes at least one of the following: the adjustment of the distance B1 between the first liquid recovery surface 31 and the front surface of the substrate P in the Z axial directions; and the adjustment of the distance B2 between the third liquid recovery surface 33 and the front surface of the substrate P in the Z axial directions.

In addition, the control apparatus 3 can adjust the positional relationship between the emergent surface 5 and the lower surface 6 in the Z axial directions by operating the first drive apparatus 11 and can adjust the positional relationship between the emergent surface 5 and the liquid recovery port 8 (i.e., the liquid recovery surface 30) in the Z axial directions by operating the second drive apparatus 12. The adjustment of the positional relationship between the emergent surface 5 and the lower surface 6 in the Z axial directions includes the adjustment of a distance C between the emergent surface 5 and the lower surface 6 in the Z axial directions. The adjustment of the positional relationship between the emergent surface 5 and the liquid recovery port 8 (i.e., the liquid recovery surface 30) in the Z axial directions includes the adjustment of a distance D between the emergent surface 5 and the liquid recovery port 8 (i.e., the liquid recovery surface 30) in the Z axial directions. In the present embodiment, the distance D includes, in the Z axial directions, the distance D1 between the emergent surface 5 and the first liquid recovery surface 31 and a distance D2 between the emergent surface 5 and the third liquid recovery surface 33.

In the present embodiment, the adjustment of the distance C between the emergent surface 5 and the lower surface 6 in the Z axial directions includes the adjustment of the distance A between the lower surface 6 and the front surface of the substrate P in the Z axial directions. In addition, the adjustment of the distance D between the emergent surface 5 and the liquid recovery port 8 (i.e., the liquid recovery surface 30) in the Z axial directions includes the adjustment of the distance B between the liquid recovery port 8 (i.e., the liquid recovery surface 30) and the front surface of the substrate P in the Z axial directions. As discussed above, the position of the last optical element 4 of the projection optical system PL supported by the first base plate 15 is substantially fixed. In addition, during, for example, the normal operation of exposing the substrate P, the front surface (the exposure surface) of the substrate P might be moved in the Z axial, θX, and θY directions so that it has a prescribed positional relationship with (i.e., coincides with) the image plane of the projection optical system PL; however, that amount of movement is extremely small. Namely, during the normal operation of exposing the substrate P, the distance E between the emergent surface 5 and the front surface of the substrate P in the Z axial directions is substantially determined in advance, and the amount of change in the distance E is extremely small. Accordingly, in the present embodiment, the adjustment of the distance C between the emergent surface 5 and the lower surface 6 is substantially equal to the adjustment of the distance A between the lower surface 6 and the front surface of the substrate P; furthermore, the adjustment of the distance D between the emergent surface 5 and the liquid recovery port 8 (i.e., the liquid recovery surface 30) is substantially equal to the adjustment of the distance B between the liquid recovery port 8 (i.e., the liquid recovery surface 30) and the front surface of the substrate P.

Thus, in the present embodiment, the control apparatus 3 can adjust the distance A between the lower surface 6 and the front surface of the substrate P by adjusting the distance C between the emergent surface 5 and the lower surface 6, and can adjust the distance B between the liquid recovery port 8 (i.e., the liquid recovery surface 30) and the front surface of the substrate P by adjusting the distance D between the emergent surface 5 and the liquid recovery port 8 (i.e., the liquid recovery surface 30).

In addition, the control apparatus 3 can adjust the positional relationship between the lower surface 6 of the first member 7 and the first liquid recovery surface 31 of the second member 9 by operating at least one of the following: the first drive apparatus 11 and the second drive apparatus 12. The adjustment of the positional relationship between the lower surface 6 and the first liquid recovery surface 31 in the Z axial directions includes the adjustment of a distance F (the size of the step 35) between the lower surface 6 and the first liquid recovery surface 31 in the Z axial directions.

In the state shown in FIG. 5, the distance C is different from the distance D1 but is equal to the distance D2.

Furthermore, in the present embodiment, as shown in FIG. 5, the front surface of the object (here, the substrate P) is disposed so that it is substantially parallel to the XY plane and substantially coincides with the image plane of the projection optical system PL; furthermore, the initial state is the state wherein the distance A and the distance B2 are equal and the distance A and the distance C are equal. Where appropriate in the explanation below, in the initial state shown in FIG. 5, the distance A is called an initial distance $A_0$, the distance B is called an initial distance $B_0$ (wherein the distance B1 is called an initial distance $B1_0$ and the distance B2 is called an initial distance $B2_0$), the distance C is called an initial distance $C_0$, the distance D is called an initial distance $D_0$ (wherein the distance D1 is called an initial distance $D1_0$ and the distance D2 is called an initial distance $D2_0$), the distance E is called an initial distance $E_0$, and the distance F is called an initial distance $F_0$.

In the present embodiment, the first member 7 has liquid supply ports 37, which supply the liquid LQ to the optical path K of the exposure light EL. The liquid supply ports 37 are disposed in the vicinity of the optical path K and are capable of supplying the liquid LQ to the optical path K. To form the immersion space LS, the liquid supply ports 37 are capable of supplying the liquid LQ to the space between the emergent surface 5 and the lower surface 6 on one side and the front surface of the substrate P on the other side.

In the present embodiment, the liquid supply ports 37 each face a direction other than the −Z direction. The liquid supply ports 37 are disposed in the first member 7 in the vicinity of the optical path K of the exposure light EL so that they face the optical path K.

In the present embodiment, the first member 7 is disposed around the optical path K of the exposure light EL and has an upper surface 38 that opposes the emergent surface 5 with a prescribed gap G3 interposed therebetween. In the present embodiment, the upper surface 38 includes the upper surface of the lower plate part 24. The upper surface 38 is flat and is substantially parallel to the XY plane. The upper surface 38 is disposed around the opening 27. The liquid supply ports 37 are capable of supplying the liquid LQ to a space 39 between the emergent surface 5 and the upper surface 38. In the present embodiment, the liquid supply ports 37 are disposed on opposite sides of the optical path K in the Y axial directions (one on each side). In the explanation below, the space 39 is called the internal space 39 where appropriate.

As shown in FIG. 2, the liquid supply ports 37 are connected to a liquid supply apparatus 41 via passageways 40. The liquid supply apparatus 41 comprises a temperature adjusting apparatus and a flow control apparatus, which is called a mass flow controller; furthermore, the liquid supply apparatus 41 is capable of feeding a prescribed amount per unit of time of the liquid LQ, which is pure and temperature adjusted. The liquid supply apparatus 41 is capable of controlling the amount of the liquid LQ supplied per unit of time. Each passageway 40 comprises a supply passageway 40A, which is formed inside the first member 7, and a passageway 40B, which is formed from a supply pipe that connects the supply passageway 40A and the liquid supply apparatus 41. The liquid LQ that is fed from the liquid supply apparatus 41 is supplied to each of the supply ports 37 through the corresponding passageway 40. The supply ports 37 supply the liquid LQ from the liquid supply apparatus 41 to the optical path K.

The liquid recovery port 8 is connected to a liquid recovery apparatus 43 via a passageway 42. The liquid recovery apparatus 43 is capable of recovering the liquid LQ by suctioning the liquid LQ using a vacuum system. The liquid recovery apparatus 43 can control the amount of the liquid LQ recovered per unit of time. The passageway 42 comprises a recovery passageway 42A, which is formed inside the second member 9, and a passageway 42B, which is formed from a recovery pipe that connects the recovery passageway 42A and the liquid recovery apparatus 43. In the present embodiment, the control apparatus 3 recovers the liquid LQ via the porous member 34 (i.e., the liquid recovery surface 30) by operating the liquid recovery apparatus 43 to create a pressure differential between the upper surface and the lower surface of the porous member 34. The liquid LQ that is recovered from the liquid recovery surface 30 is recovered by the liquid recovery apparatus 43 through the passageway 42.

The control apparatus 3 controls the operation of the liquid supply apparatus 41 and the liquid recovery apparatus 43. The control apparatus 3 is capable of adjusting the amount of the liquid LQ supplied per unit of time via the liquid supply ports 37 by controlling the liquid supply apparatus 41. In addition, the control apparatus 3 is capable of adjusting the amount of the liquid LQ recovered per unit of time from the liquid recovery port 8 by controlling the liquid recovery apparatus 43.

In the present embodiment, the control apparatus 3 can set the liquid supply apparatus 41 to at least one of the following modes: a first mode that sets the amount of the liquid LQ supplied per unit of time from the liquid supply ports 37 to a first amount that is less than the prescribed amount to be supplied; and a second mode that sets such to a second amount that is greater than the prescribed amount to be supplied. Furthermore, a configuration may be adopted such that the amount of the liquid LQ supplied can be set flexibly.

In the present embodiment, the control apparatus 3 selects either the first mode or the second mode in accordance with contact angle information (e.g., receding contact angle and hysteresis) of the liquid LQ at the front surface of the object that opposes the emergent surface 5. For example, the control apparatus 3 selects either the first mode or the second mode in accordance with the contact angle of the liquid LQ at the front surface of the substrate P held by the substrate stage 2. In the present embodiment, the control apparatus 3 selects the first mode if the receding contact angle of the liquid LQ at the front surface of the substrate P is relatively large (e.g., if the receding contact angle is 80° or greater) and selects the second mode if the receding contact angle of the liquid LQ is relatively small (e.g., if the receding contact angle is less than 80°).

Furthermore, the first mode or the second mode may be selected based on information other than the contact angle information discussed above or may be selected based on both the contact angle information discussed above and other information.

It may be necessary to consider, for example, the force (pressure) that the liquid LQ exerts upon the last optical element 4 and/or the substrate stage 2 (the substrate P), changes in the temperature of the liquid LQ, and the like. Ensuring that the amount of the liquid LQ supplied per unit of time from the liquid supply ports 37 is on the small side can reduce the force (pressure) of the liquid LQ that acts on the last optical element 4. In addition, ensuring that the amount of the liquid LQ supplied per unit of time from the liquid supply ports 37 is on the small side also can reduce the force (pressure) of the liquid LQ that acts on the substrate P or the substrate stage 2. Moreover, if the amount of the liquid LQ supplied per unit of time from the liquid supply ports 37 is small, then flow of the liquid LQ will be small, and consequently temperature changes (a temperature distribution) in the liquid LQ owing to, for example, irradiation by the exposure light EL will tend to occur.

Ensuring that the amount of the liquid LQ supplied per unit of time from the liquid supply ports 37 is on the large side can prevent temperature changes (a temperature distribution) in the liquid LQ owing to, for example, irradiation by the exposure light EL. Moreover, if the amount of the liquid LQ supplied per unit of time from the liquid supply ports 37 is large, then there is a possibility that the force (pressure) exerted by the liquid LQ on the last optical element 4 and the substrate stage 2 (the substrate P) will increase.

As shown in FIG. 3, in the present embodiment, the first member 7 has exhaust ports 45, which bring the internal space 39 and an external space 44 (i.e., the ambient environment)

surrounding the first member 7 (i.e., the immersion space LS) into communication. The exhaust ports 45 are disposed in the vicinity of the internal space 39 and are capable of exhausting the gas therein. In the present embodiment, the exhaust ports 45 are provided on opposite sides (one on each side) of the optical path K in the X axial directions. The exhaust ports 45 are connected to exhaust passageways 46, which are formed inside the first member 7. The openings 47 at the upper ends of the exhaust passageways 46 are disposed at positions at which they can contact the gas in the external space 44. The gas in the external space 44 can flow into the internal space 39 via the exhaust passageways 46, and the gas in the internal space 39 can flow out to the external space 44 via the exhaust passageways 46. In the present embodiment, the gas can flow continuously back and forth between the internal space 39 and the external space 44 (i.e., the atmospheric space), which is outside of the internal space 39, via the exhaust passageways 46, and the internal space 39 is open to the atmosphere via the same.

In the present embodiment, the lower surface 6 of the first member 7 is lyophilic with respect to the liquid LQ. For example, the contact angle between the lower surface 6 and the liquid LQ is less than 40°, and is preferably less than 20°. The lower surface 6 is lyophilic with respect to the liquid LQ, and therefore can maintain contact with the liquid LQ of the immersion space LS even if the substrate P is moved in the X and Y directions. The lower surface 6 maintains contact with the liquid LQ of the immersion space LS during at least the exposure of the substrate P. Furthermore, there is no need for the entire lower surface 6 to maintain contact with the liquid LQ; however, to maintain the state wherein the optical path K is filled with the liquid LQ, at least part of the lower surface 6 should maintain contact with the liquid LQ.

In addition, in the present embodiment, the emergent surface 5 and the lower surface 6 can hold the liquid LQ between themselves and the front surface of the substrate P; furthermore, at least part of the liquid recovery surface 30 can hold the liquid LQ between itself and the front surface of the substrate P. FIG. 2 and FIG. 5 show a state wherein part of the liquid LQ on the substrate P is held between the substrate P on one side and the lower surface 6 and part of the area of the liquid recovery surface 30 on the other side. For example, during an exposure of the substrate P, the immersion space LS is formed by the holding of the liquid LQ between the lower surface 6 and the liquid recovery surface 30 on one side and the front surface of the substrate P on the other side.

In the present embodiment, the immersion space LS is formed so that part of the area (a local area) of the front surface of the substrate P, which is disposed at a position at which it opposes the emergent surface 5 and the lower surface 6, is covered by the liquid LQ, and an interface (i.e., meniscus or edge) LG of the liquid LQ in the immersion space LS is formed between at least the front surface of the substrate P and the liquid recovery surface 30. Namely, the exposure apparatus EX of the present embodiment adopts a local liquid immersion system wherein the immersion space LS is formed so that the part of the area on the substrate P that includes the projection region PR of the projection optical system PL is covered with the liquid LQ during the exposure of the substrate P.

The following text explains a method of using the exposure apparatus EX that has the abovementioned configuration to perform an immersion exposure on the substrate P.

The control apparatus 3 supplies the liquid LQ from the liquid supply ports 37 to the optical path K. The liquid LQ that is fed from the liquid supply apparatus 41 is supplied to each liquid supply port 37 through the corresponding passageway 40. The liquid supply ports 37 supply the liquid LQ to the internal space 39. The liquid LQ flows through the internal space 39 and the opening 27 into the space between the lower surface 6 and the front surface of the substrate P. In addition, at least part of the liquid LQ flows into the space between the liquid recovery surface 30 and the front surface of the substrate P.

In addition, in the present embodiment, the control apparatus 3 performs the liquid recovery operation, wherein the liquid recovery port 8 (i.e., the liquid recovery surface 30) is used, in parallel with performing the liquid supply operation, wherein the liquid supply ports 37 are used. At least part of the liquid LQ that contacts the liquid recovery surface 30 is recovered through the porous member 34, which forms the liquid recovery surface 30. Thereby, the immersion space LS is formed so that the optical path K between the emergent surface 5 of the last optical element 4 and the front surface of the substrate P is filled with the first liquid LQ.

In the state wherein the immersion space LS has been formed, the control apparatus 3 starts the exposure of the substrate P. A plurality of shot regions, which are exposure target areas, are disposed as a matrix on the substrate P. To expose a first shot region on the substrate P, the control apparatus 3 exposes the first shot region through the projection optical system PL and the liquid LQ on the substrate P while moving the front surface of the substrate P (the first shot region) in the Y axial directions with respect to the last optical element 4. To start the exposure of a second shot region after the exposure of the first shot region on the substrate P is complete, the control apparatus 3 performs an operation (stepping operation) wherein the front surface of the substrate P is moved in one of the X axial directions (or in a direction that is inclined with respect to the X axial directions within the XY plane) in a state wherein the immersion space LS is formed and then moves a second shot region to the exposure start position. Furthermore, the control apparatus 3 starts the exposure of the second shot region.

The control apparatus 3 sequentially exposes a plurality of shot regions on the substrate P by repetitively performing: a scanning exposure operation that exposes the current shot region while moving that shot region in the Y axial directions with respect to the last optical element 4; and a stepping operation that, after the exposure of the current shot region is complete, moves the next shot region to the exposure start position.

In the present embodiment, the temperature of the liquid LQ is monitored during the exposures of the plurality of shot regions on the substrate P. In the present embodiment, a temperature sensor capable of detecting the temperature of the liquid LQ is disposed so that it is capable of contacting the liquid LQ in, for example, one of the following locations: in the vicinity of the liquid supply ports 37; in one of the passageways 40A; in the passageway 40B; in the vicinity of the liquid recovery port 8; in the passageway 42A; and in the passageway 42B. The control apparatus 3 uses that temperature sensor to detect the temperature of the liquid LQ in the immersion space LS during the exposures of the plurality of shot regions on the substrate P.

Based on the detection result of the temperature sensor, the control apparatus 3 determines, for each of the shot regions, whether the temperature of the liquid LQ during the exposure of the relevant shot region was within a permissible range that is prescribed in advance. In other words, the control apparatus 3 verifies, for each of the shot regions, whether the temperature of the liquid LQ during the exposure was within the permissible range.

If the control apparatus 3 determines, based on the detection results of the temperature sensor, that at least one shot region was exposed through the liquid LQ at a temperature outside of the permissible range, then after the exposures of all shot regions on the substrate P are complete and before that exposed substrate P is unloaded from the substrate stage 2, the control apparatus 3 uses the output apparatus 3D to output an error. If an error is output, then the control apparatus 3 stops the operation of processing the substrate P and stands by until the temperature of the liquid LQ returns to within the permissible range. The control apparatus 3 uses the temperature sensor to monitor the temperature of the liquid LQ during this standby time as well. When the control apparatus 3 determines, based on the result of the temperature sensor, that the temperature of the liquid LQ has returned to within the permissible range, the control apparatus 3 resumes the operation of processing the substrate P.

Furthermore, the control apparatus 3 can also stop (interrupt) the operation of processing the substrate P at the point in time it determines that the temperature of the liquid LQ during the exposure of that substrate P is outside of the permissible range.

In the present embodiment, the control apparatus 3 uses the first drive apparatus 11 and the second drive apparatus 12 to drive the first member 7 or the second member 9, or both, in accordance with the supply conditions of the liquid LQ to adjust at least one of the following: the positional relationship between the lower surface 6 and the front surface of the substrate P in the Z axial directions; and the positional relationship between the liquid recovery port 8 (i.e., the liquid recovery surface 30) and the front surface of the substrate P in the Z axial directions. Furthermore, either the lower surface 6 or the liquid recovery port 8 (i.e., the liquid recovery surface 30) may be moved in accordance with the supply conditions of the liquid LQ; furthermore, both the lower surface 6 and the liquid recovery surface 30 may be moved. In addition, both the lower surface 6 and the liquid recovery port 8 (i.e., the liquid recovery surface 30) may be moved in the same direction (the +Z axial direction or the −Z axial direction) in accordance with the supply conditions of the liquid LQ; furthermore, the lower surface 6 and the liquid recovery surface 30 may be moved in opposite directions. In addition, if the lower surface 6 or the liquid recovery port 8 (i.e., the liquid recovery surface 30), or both, are moved in accordance with the supply conditions of the liquid LQ, then the relative position between the lower surface 6 and the liquid recovery port 8 (i.e., the liquid recovery surface 30) may change, or may not change.

The adjustment of the positional relationship between the lower surface 6 and the front surface of the substrate P in the Z axial directions includes the adjustment of the distance A between the lower surface 6 and the front surface of the substrate P in the Z axial directions. In addition, the adjustment of the positional relationship between the liquid recovery port 8 (i.e., the liquid recovery surface 30) and the front surface of the substrate P in the Z axial directions includes the adjustment of the distance B between the liquid recovery port 8 (i.e., the liquid recovery surface 30) and the front surface of the substrate P in the Z axial directions. In addition, the adjustment of the distance A between the lower surface 6 and the front surface of the substrate P includes the adjustment of the distance C between the emergent surface 5 and the lower surface 6, and the adjustment of the distance B between the liquid recovery port 8 (i.e., the liquid recovery surface 30) and the front surface of the substrate P includes the adjustment of the distance D between the emergent surface 5 and the liquid recovery port 8 (i.e., the liquid recovery surface 30).

In the present embodiment, the first drive apparatus 11 comprises a measuring apparatus (not shown), which comprises an encoder system capable of measuring the amount of drive generated by the drive mechanisms 11A in the Z axial directions. The measuring apparatus is capable of measuring the amount of movement of the connecting members 11B, which are connected to the first member 7 and are driven by the drive mechanisms 11A. The measuring apparatus is also capable of measuring the amount of movement of the connecting members 11B (the first member 7) with respect to a prescribed reference position in the Z axial directions. In the present embodiment, for example, the emergent surface 5 of the last optical element 4 is used as this reference position. The measuring apparatus measures the amount of movement of the first member 7 with respect to the emergent surface 5 of the last optical element 4 in the Z axial directions. The encoder system of the measuring apparatus comprises a scale member and an encoder head that detects a scale (a grating) on that scale member; in addition, the position of the scale member or the encoder head, or both, is fixed. The scale member or the encoder head, or both, is disposed in a fixed member, the position of which is fixed, such as the first base plate 15. Accordingly, the encoder system can detect the position (the amount of movement) of the first member 7 with respect to that fixed member. In addition, the projection optical system PL, which comprises the last optical element 4, is supported by the first base plate 15, the position of which is fixed. Accordingly, the measuring apparatus can derive both the amount of movement of the first member 7, using the emergent surface 5 as the reference position, as well as the position of the lower surface 6 of the first member 7 with respect to the emergent surface 5.

In the present embodiment, the first drive apparatus 11 adjusts the position of the lower surface 6 with respect to the emergent surface 5 in the Z axial directions based on the measurement result of the measuring apparatus; namely, the first drive apparatus 11 adjusts the distance C between the emergent surface 5 and the lower surface 6 and adjusts the distance A between the lower surface 6 and the front surface of the substrate P.

Similar to the first drive apparatus 11, the second drive apparatus 12 comprises a measuring apparatus (not shown) that is capable of measuring the amount of drive of the drive mechanism 12A in the Z axial directions. The measuring apparatus is capable of measuring the amount of movement of the connecting member 12B, which is connected to the second member 9. The measuring apparatus measures the amount of movement of the second member 9 in the Z axial directions using the emergent surface 5 of the last optical element 4 as a reference position.

In the present embodiment, the second drive apparatus 12 adjusts the position of the liquid recovery port 8 (i.e., the liquid recovery surface 30) with respect to the emergent surface 5 in the Z axial directions based on the measurement result of the measuring apparatus; namely, the second drive apparatus 12 adjusts the distance D between the emergent surface 5 and the liquid recovery port 8 (i.e., the liquid recovery surface 30) and adjusts the distance B between the liquid recovery port 8 (i.e., the liquid recovery surface 30) and the front surface of the substrate P.

The supply conditions of the liquid LQ that fills the optical path K of the exposure light EL include the amount of the liquid LQ supplied per unit of time to the optical path K. In the present embodiment, the supply conditions of the liquid LQ also include the selected mode, namely the first mode or the second mode discussed above.

Figure 6:
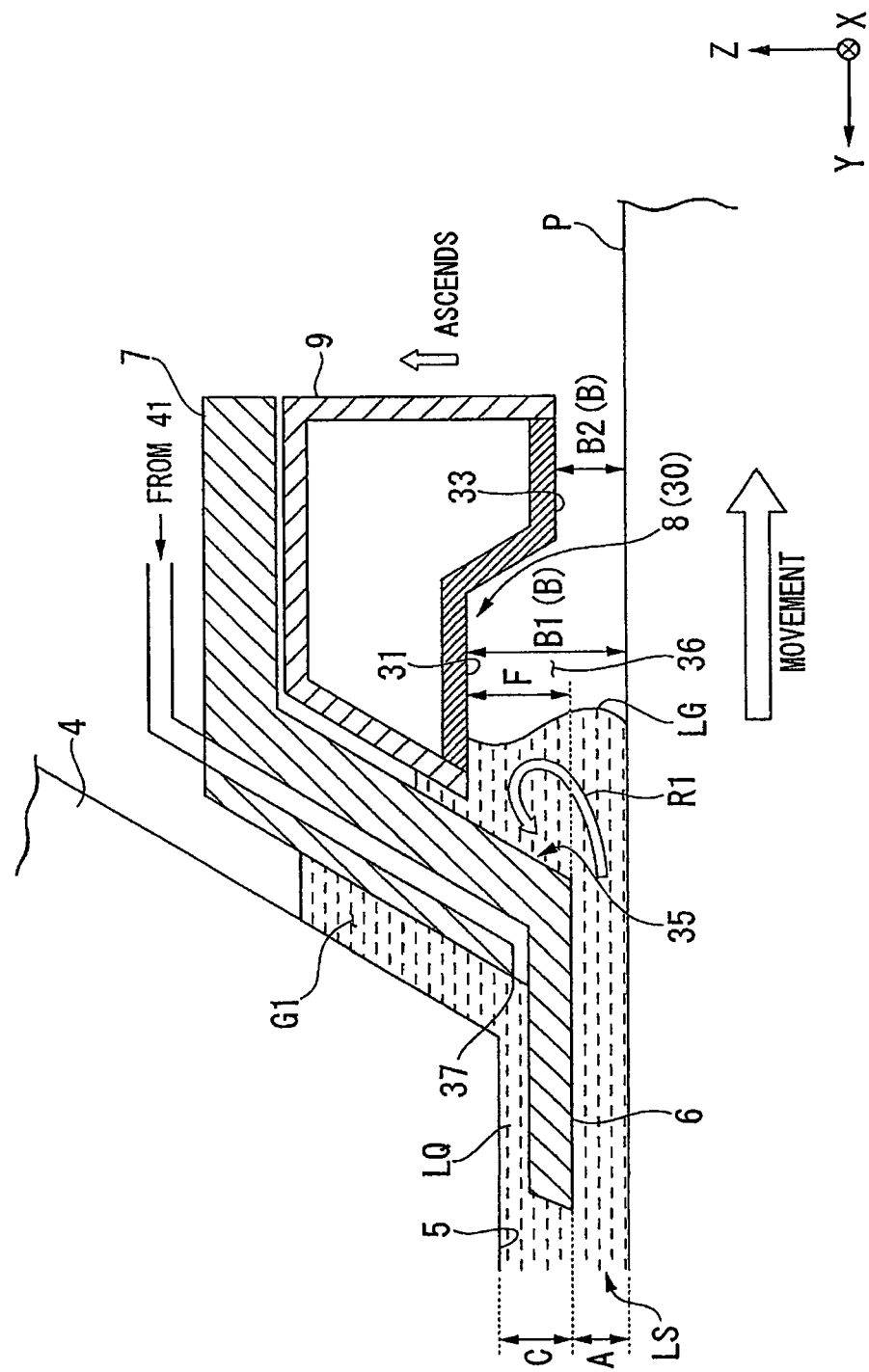
FIG. 6 is a view for explaining one example of the operation of the first member and the second member according to the present embodiment.

If one desires, for example, to decrease the amount of the liquid LQ supplied per unit of time from the liquid supply ports 37, namely if the first mode is set, then the control apparatus 3 moves the first member 7 or the second member 9, or both, in the Z axial directions so that the distance F between the lower surface 6 of the first member 7 and the first liquid recovery surface 31 is greater than the initial distance $F_0$. In the present embodiment, the second member 9 is moved in the +Z direction as shown in FIG. 6. Namely, the second member 9 is moved in the +Z direction so that the distance B between the first liquid recovery surface 31 and the substrate P is greater than the initial distance $B_0$. If the substrate P is moved in the −Y direction with respect to the last optical element 4 as shown in FIG. 6, then the liquid LQ in the vicinity of the step 35 tends not to flow in the −Y direction. Moving the substrate P in the −Y direction impedes any flow of the liquid LQ in the −Y direction that would be otherwise generated between the lower surface 6 and the front surface of the substrate P as a result of the pressure loss at the step 35 (between the first liquid recovery surface 31 and the front surface of the substrate P). When the substrate P is moved in the −Y direction, a flow (a vortex) of the liquid LQ is created, as shown by an arrow R1 in FIG. 6, in the vicinity of the step 35, thereby preventing the interface LG of the liquid LQ from moving in the −Y direction. Increasing the size of the distance B, and thereby increasing the size of the step 35 (the distance F), more effectively prevents the interface LG of the liquid LQ from moving in the −Y direction. As a result, the position of the surface (i.e., the air-liquid interface or the meniscus) of the liquid LQ in the Z axial directions within the gap G1 is prevented from moving in the −Z direction (i.e., the water level is prevented from falling). Accordingly, the surface of the liquid LQ within the gap G1 can be maintained at a high position.

If the amount of the liquid LQ supplied per unit of time from the liquid supply ports 37 is small and the interface LG of the liquid LQ moves a long distance, then, attendant with that movement of the interface LG, the position of the surface of the liquid LQ in the Z axial directions within the gap G1 will tend to move in the −Z direction. Namely, the level (the water level) of the liquid LQ within the gap G1 will tend to descend. As a result, the gap G1 may become filled with a gas, and bubbles or voids, or both, may mix with the liquid LQ between the last optical element 4 and the substrate P.

According to the present embodiment, if one desires to reduce the amount of the liquid LQ supplied per unit of time from the liquid supply ports 37, then the intermixing of bubbles or voids, or both, in the liquid LQ can be prevented by increasing the size of the step 35 (i.e., the distance F).

Figure 7:
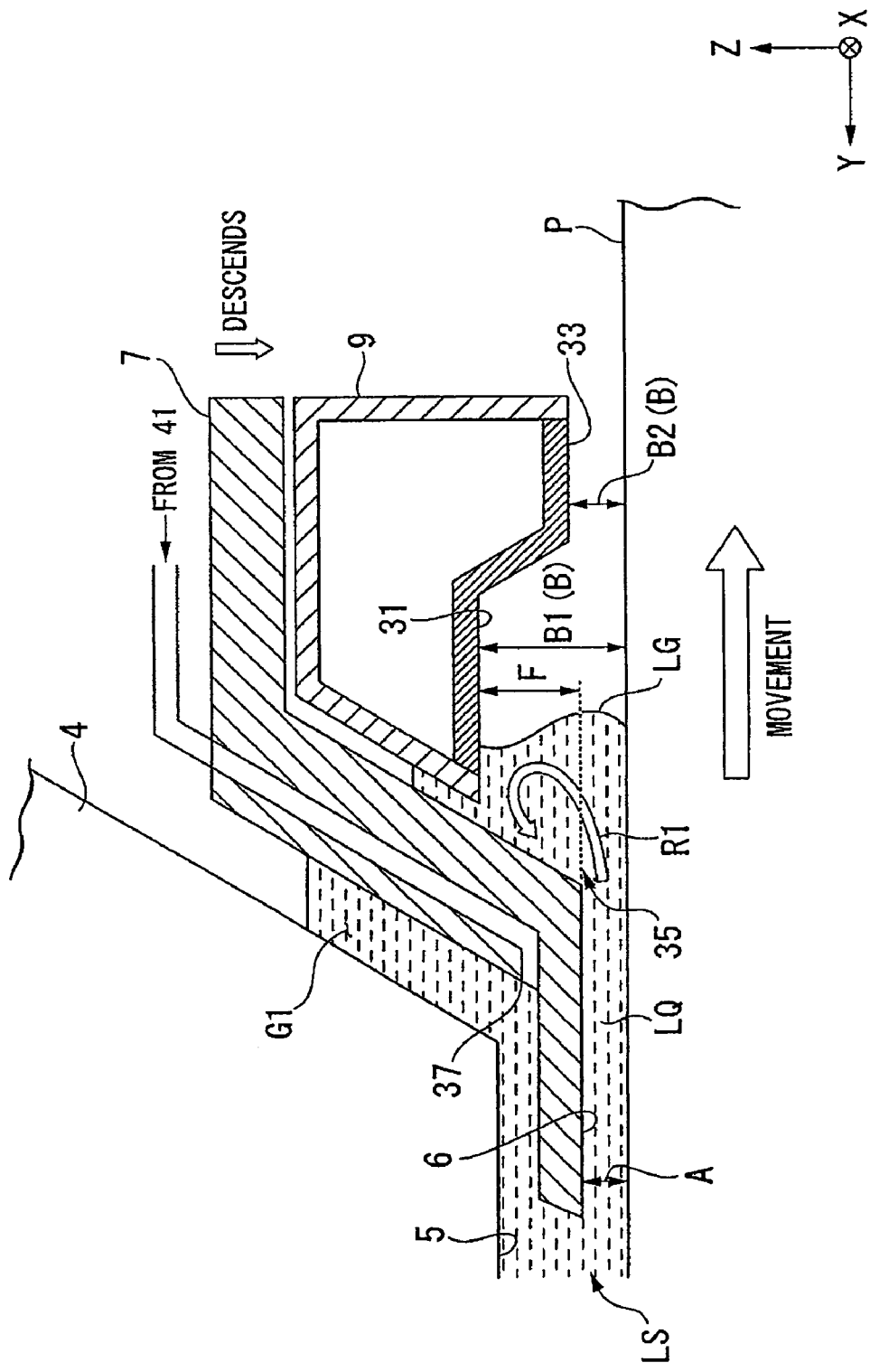
FIG. 7 is a view for explaining one example of the operation of the first member and the second member according to the present embodiment.

Furthermore, in the example shown in FIG. 6, the distance F (i.e., the step 35) is increased by the movement of the second member 9 in the +Z direction; however, as shown in FIG. 7, the first member 7 may instead be lowered in the −Z direction. As discussed above, if the amount of the liquid LQ supplied per unit of time from the liquid supply ports 37 is small, then the position of the surface of the liquid LQ within the gap G1 tends to move in the −Z direction; however, making the distance A smaller than the initial distance $A_0$ increases the loss of pressure between the lower surface 6 of the first member 7 and the front surface of the substrate P and, in turn, prevents the movement of the interface LG of the liquid LQ much more effectively. Accordingly, the level of the liquid LQ within the gap G1 is prevented from descending, which makes it possible to maintain the surface of the liquid LQ at a high position. If the first member 7 is moved in the −Z direction, then the distance F becomes greater than the initial distance $F_0$; consequently, the second member 9 does not have to be moved as shown in FIG. 7, or the second member 9 may be moved in the −Z direction or in the +Z direction, which is the opposite direction to the direction of movement of the first member 7.

Furthermore, if the first mode is set, then by merely lowering the first member 7 and thereby making the distance A smaller than the initial distance $A_0$, the distance F becomes larger than the initial distance $F_0$ and no further action is required to increase the size of the distance F. Namely, the distance A may be made substantially the same as the distance B2 or smaller than the distance B2.

Figure 8:
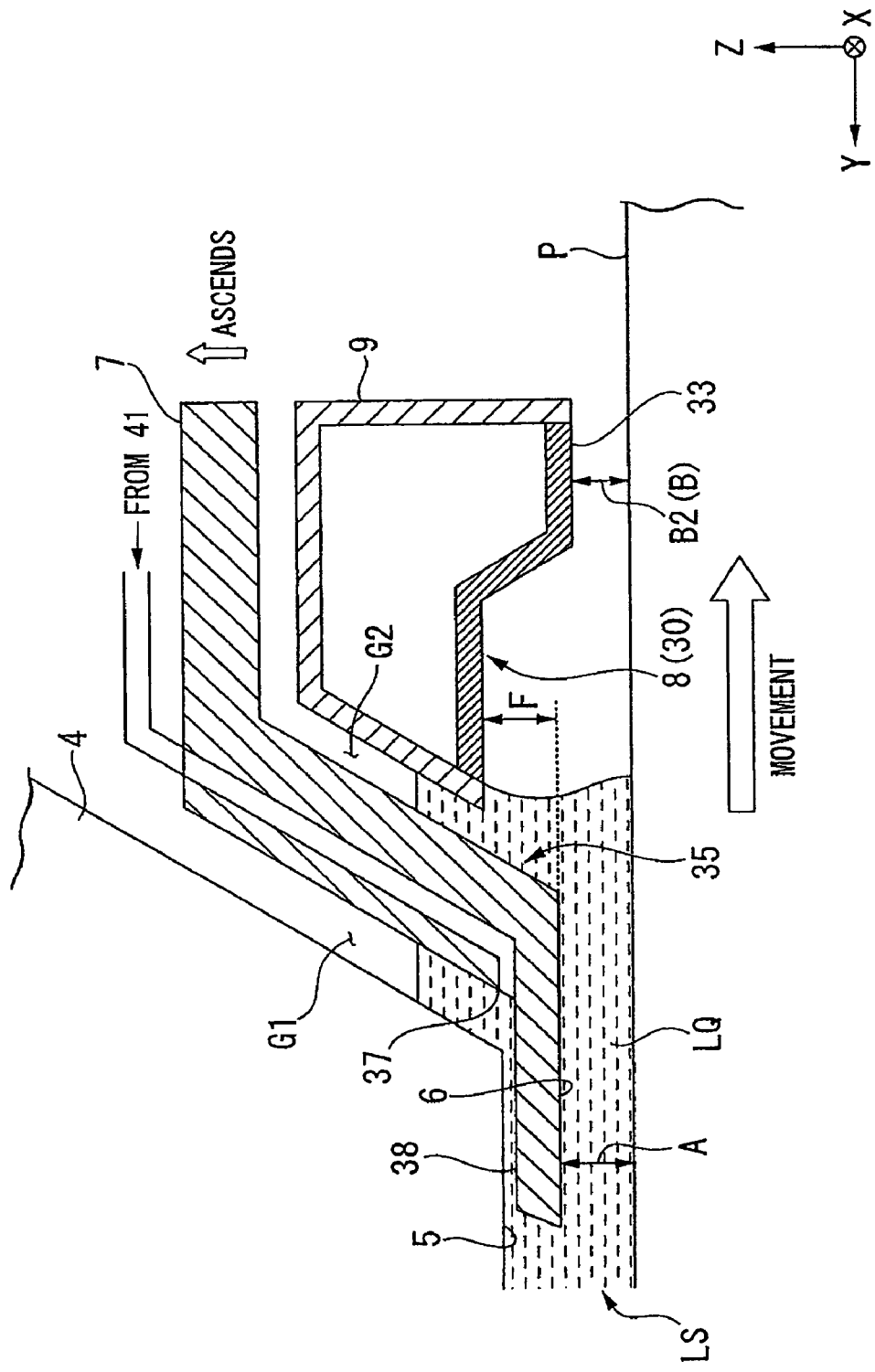
FIG. 8 is a view for explaining one example of the operation of the first member and the second member according to the present embodiment.

In addition, if one desires, for example, to increase the amount of the liquid LQ supplied per unit of time from the liquid supply ports 37, namely if the second mode is set, then, as shown in FIG. 8, the control apparatus 3 moves the first member 7 in the +Z direction so that the distance A between the lower surface 6 and the front surface of the substrate P is greater than the initial distance $A_0$. If the amount of the liquid LQ supplied per unit of time from the liquid supply ports 37 has been increased in the state wherein the distance A is small, namely in the state wherein the space between the lower surface 6 and the front surface of the substrate P is small, then, for example, the position of the surface of the liquid LQ within the gap G1 might move in the +Z direction (i.e., the air-liquid interface may rise), thereby causing the liquid LQ to overflow the upper end of the gap G1.

According to the present embodiment, if the second mode is set, then the liquid LQ can be prevented from overflowing the gap G1 by moving the first member 7 in the +Z direction so that the pressure loss between the lower surface 6 and the front surface of the substrate P decreases. In addition, moving the first member 7 in the +Z direction makes the distance F smaller than the initial distance $F_0$, which reduces the pressure loss at the step 35; furthermore, attendant with the movement of the substrate P in the −Y axial direction, the interface LG of the liquid LQ tends to move in the −Y direction. The level of the liquid LQ in the gap G1 is thereby prevented from rising, and, in turn, the liquid LQ can be prevented from overflowing the upper end of the gap G1. In addition, because, in such a case, the gap G2 would also increase in size, at least part of the liquid LQ in the immersion space LS will tend to flow into the gap G2 when the substrate P moves; in this way, too, the liquid LQ can be prevented from overflowing the upper end of the gap G1.

Furthermore, in the example shown in FIG. 8, the first member 7 may be moved in the +Z direction and the second member 9 may be lowered in the −Z direction. Namely, by lowering the second member 9 in the −Z direction, the distance F may be further reduced. As discussed above, if the amount of the liquid LQ supplied per unit of time from the liquid supply ports 37 is large, then the liquid LQ will tend to overflow the upper end of the gap G1; however, reducing the distance F in turn reduces the pressure loss at the step 35, which, in turn, can prevent the liquid LQ from overflowing the upper end of the gap G1. In addition, because the distance B2 between the third liquid recovery surface 33 and the front surface of the substrate P decreases, namely because the third liquid recovery surface 33 approaches the front surface of the substrate P, any of the liquid LQ that has formed as a thin film or a droplet on the substrate P can also be collected by the third liquid recovery surface 33.

Furthermore, if the second mode is set, then, merely by raising the first member 7 and making the distance A larger than the initial distance $A_0$, the distance F does not have to be made smaller than the initial distance $F_0$.

Figure 9:
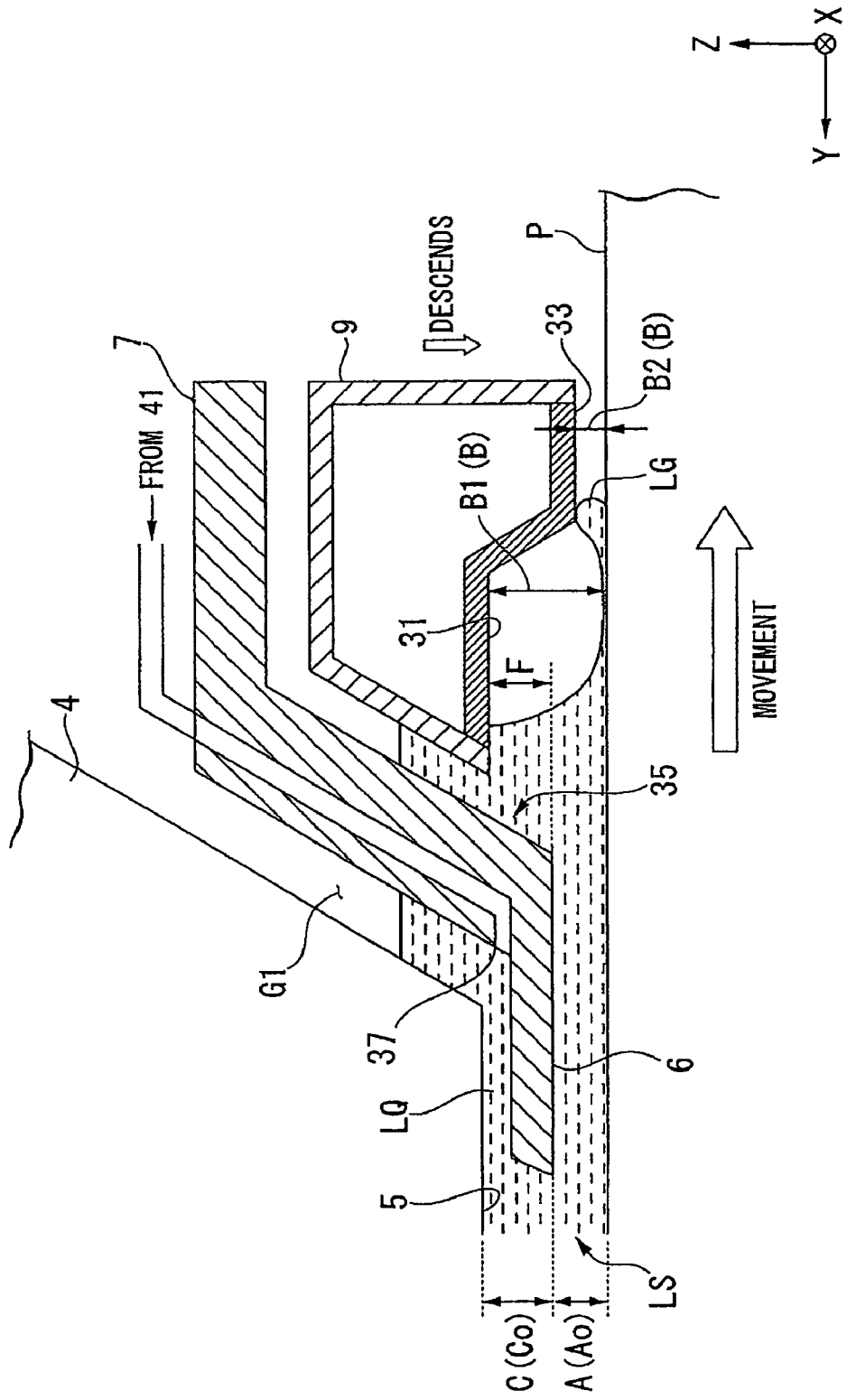
FIG. 9 is a view for explaining one example of the operation of the first member and the second member according to the present embodiment.

In addition, if the second mode is set, then the first member 7 does not have to be moved in the +Z direction, namely the distance C (and, in turn, the distance A) does not need to be modified from its initial state as shown in FIG. 5, and it suffices merely to make the distance F between the lower surface 6 of the first member 7 and the first liquid recovery surface 31 of the second member 9 smaller than the initial distance $F_0$, as shown in FIG. 9. In this case, the pressure loss at the step 35 decreases, which makes it possible to prevent the liquid LQ from flowing out of the upper end of the gap G1. In addition, because, in this case, the distance B2 between the third liquid recovery surface 33 and the front surface of the substrate P is smaller than the initial distance $B2_0$, any of the liquid LQ that has formed as a thin film on the substrate P can also be collected by the third recovery surface 33, as shown in FIG. 9.

Furthermore, with or without taking the supply conditions of the liquid LQ into consideration as discussed above, at least one of the following may be adjusted in accordance with the movement conditions of the substrate P: the positional relationship between the lower surface 6 and the front surface of the substrate P in the Z axial directions; and the positional relationship between the liquid recovery port 8 (i.e., the liquid recovery surface 30) and the front surface of the substrate P in the Z axial directions. The movement conditions of the substrate P include the movement velocities of the substrate P within the XY plane. The movement velocities of the substrate P within the XY plane include, for example, the movement velocity of the substrate P in the Y axial directions during a scanning exposure and the movement velocity of the substrate P in the X axial directions (or in the directions inclined with respect to in the X axial directions within the XY plane) during the stepping operation. In addition, the movement conditions of the substrate P include linear distances of continuous movement of the substrate P in a prescribed direction within the XY plane. The linear distances of continuous movement of the substrate P in the prescribed direction within the XY plane include, for example, the linear distance of continuous movement of the substrate P in the Y axial directions during the scanning exposure operation and the linear distance of continuous movement of the substrate P in the X axial directions (or in the directions inclined with respect to the X axial directions within the XY plane) during the stepping operation.

If, for example, the substrate P is moved at high speed in the −Y direction with respect to the last optical element 4, or if the substrate P is moved linearly for a long distance in the −Y direction, then the control apparatus 3 moves the first member 7 and the second member 9 in the −Z direction; thereby, the distance C between the emergent surface 5 and the lower surface 6 is made larger than the initial distance $C_0$, the distance A between the lower surface 6 and the front surface of the substrate P is made smaller than the initial distance $A_0$, and the distance B2 between the third liquid recovery surface 33 and the front surface of the substrate P is made smaller than the initial distance $B2_0$. Thereby, the pressure loss between the lower surface 6 and the front surface of the substrate P increases, which makes it possible to prevent the interface LG of the liquid LQ from moving attendant with the movement of the substrate P. In addition, because the distance B2 between the third liquid recovery surface 33 and the front surface of the substrate P is small, the liquid LQ on the substrate. P forms, for example, a thin film or a droplet, and this liquid LQ can also be collected by the third liquid recovery surface 33. Furthermore, the first member 7 and the second member 9 may be lowered such that the distance F between the lower surface 6 and the first liquid recovery surface 31 becomes greater than the initial distance $F_0$. Thereby, the pressure loss owing to the step 35 between the lower surface 6 and the first liquid recovery surface 31 increases, which makes it possible to more effectively prevent the interface LG of the liquid LQ from moving as the substrate P moves. Thus, by moving the first member 7 or the second member 9, or both, in the Z axial directions in accordance with the movement conditions of the substrate P, the liquid LQ can be prevented from leaking out of the space between the first member 7 and the second member 9 on one side and the substrate P on the other side, and the liquid LQ (i.e., the film, the droplet, or the like of the liquid LQ) can be prevented from remaining on the front surface of the substrate P.

In addition, in the examples explained referencing FIG. 6 through FIG. 9, the positions of the lower surface 6 and the liquid recovery surface 30 are fixed during the exposure of a single substrate P; however, the lower surface 6 or the liquid recovery surface 30, or both, may move in the Z axial directions during the exposure of a single substrate P. For example, because the movement conditions of the substrate P change during its exposure, the lower surface 6 or the liquid recovery surface 30, or both, may move in the Z axial directions in accordance with the various movement conditions.

In addition, the distance A between the lower surface 6 and the front surface of the substrate P in the Z axial directions or the distance B between the liquid recovery port 8 (i.e., the liquid recovery surface 30) and the front surface of the substrate P, or both, may be adjusted by moving the first member 7 or the second member 9, or both, in the Z axial directions in accordance with the distance E between the emergent surface 5 of the last optical element 4 and the front surface of the substrate P in the Z axial directions.

Figure 10:
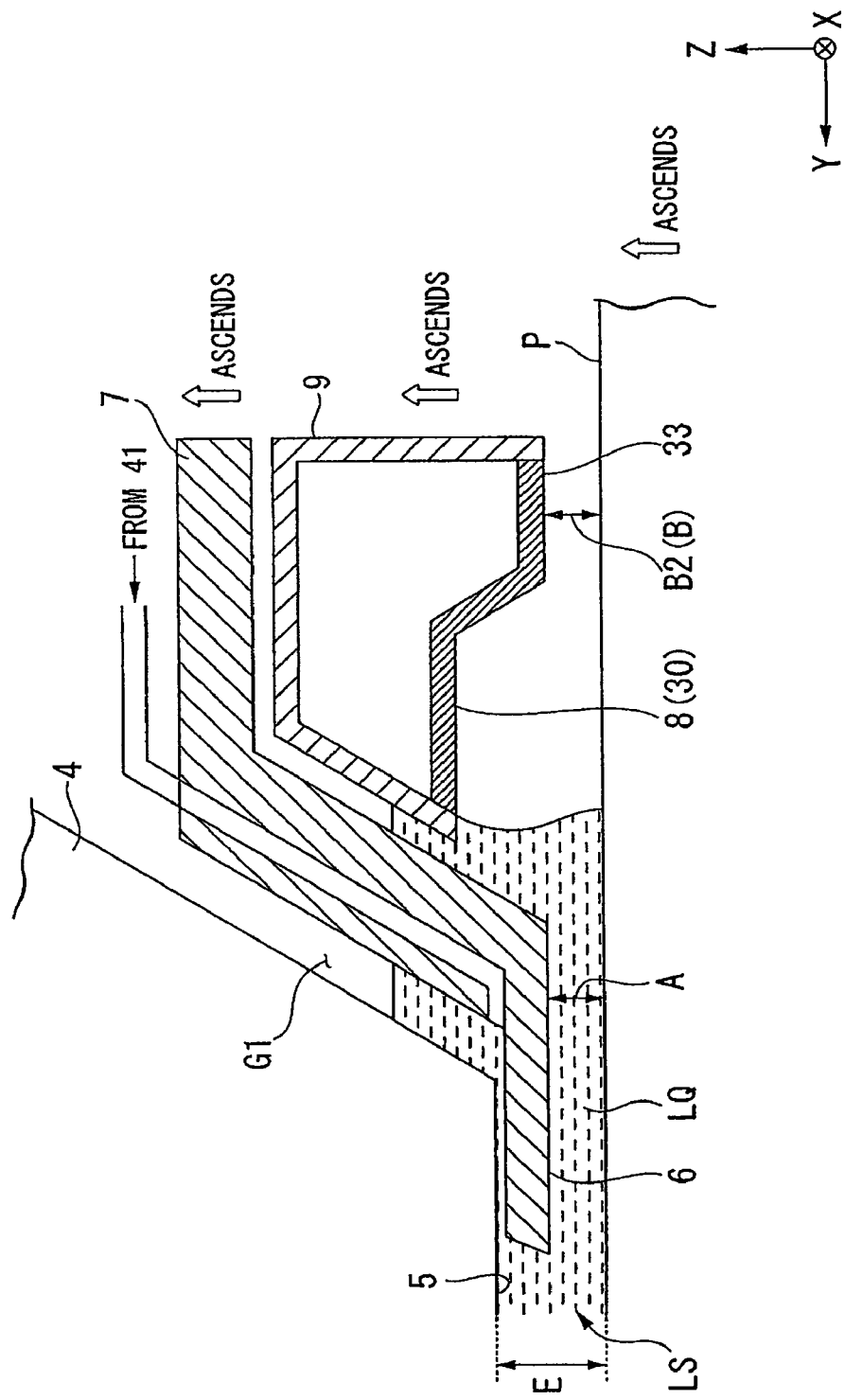
FIG. 10 is a view for explaining one example of the operation of the first member and the second member according to the present embodiment.

For example, if the front surface of the substrate P is moved in the +Z direction and the distance E decreases as shown in FIG. 10, then the control apparatus 3 adjusts the positions of the lower surface 6 and the liquid recovery surface 30 so that the distance A between the lower surface 6 and the front surface of the substrate P and the distance B between the liquid recovery surface 30 and the front surface of the substrate P increase. Moving the front surface of the substrate P in the +Z direction and reducing the distance E, however, creates the possibility that the lower surface 6 and the liquid recovery surface 30 will contact the front surface of the substrate P. For example, the distance E may decrease as a result of an operational error of the substrate stage 2 that holds the substrate P. By adjusting the positions of the lower surface 6 and the liquid contact surface (liquid recovery surface 30) in the Z axial directions in accordance with the distance E, however, the lower surface 6 or the liquid recovery surface 30, or both, can be prevented from contacting (colliding with) the substrate P. In the present embodiment, the position of the front surface of the substrate P is detected by the detection system 50, and therefore, the control apparatus 3 can use the detection system 50 to detect the position of the front surface of the substrate P and, based on that detection result, can adjust the position of the lower surface 6 or the liquid recovery surface 30, or both, and thereby prevent the lower surface 6 and the liquid recovery surface 30 from contacting the substrate P—even if, for example, an operational error occurs in the substrate stage 2.

In addition, as a result of, for example, an operational error of the substrate stage 2, the front surface of the substrate P might move in the −Z direction and thereby increase the distance E. In such a case, too, the control apparatus 3 can adjust the distance A between the lower surface 6 and the front surface of the substrate P or the distance B between the liquid recovery surface 30 and the front surface of the substrate P, or both, in accordance with the distance E. For example, if the front surface of the substrate P moves in the −Z direction and the distance E thereby increases, then the control apparatus 3 moves the first member 7 and the second member 9 in the −Z direction so that the distance A between the lower surface 6 and the front surface of the substrate P and the distance B between the liquid recovery surface 30 and the front surface of the substrate P both decrease. Thereby, even if the front surface of the substrate P moves in the −Z direction, the position of the lower surface 6 is adjusted so that the liquid LQ can be satisfactorily held between the lower surface 6 and the front surface of the substrate P and the position of the liquid recovery surface 30 is adjusted so that the liquid LQ on the substrate P can be satisfactorily recovered.

Furthermore, the examples explained referencing FIG. 6 through FIG. 10 were for cases wherein the substrate P is disposed at the exposure position; however, as discussed above, there are also cases wherein an object other than the substrate P is disposed such that it opposes the lower surface of the first member 7 and the liquid recovery surface 30 of the second member 9. For example, part (an upper surface 2T) of the substrate stage 2 may be disposed at a position at which it opposes the first member 7 and the second member 9. In this case, too, by adjusting the position of the lower surface 6 or the liquid recovery surface 30, or both, in accordance with the movement conditions of the substrate stage 2 or the supply conditions of the liquid LQ, or both, it is possible to prevent the liquid LQ from leading out, remaining behind, and the like. Furthermore, the position of the lower surface 6 or the liquid recovery surface 30, or both, may be modified to match the object that opposes the lower surface 6 and the liquid recovery surface 30. For example, if both the substrate P and the upper surface 2T of the substrate stage 2 oppose the lower surface 6 and the liquid recovery surface 30, then the position of the lower surface 6 or the liquid recovery surface 30, or both, may be different.

In addition, for example, a member that is thicker than the substrate P might be held by the substrate holding part 2H. Alternatively, a member (e.g., a measuring member) might be disposed on the upper surface 2T of the substrate stage 2 at a position that is higher than the front surface of the substrate P held by the substrate holding part 2H. For example, there are cases wherein a substrate type measuring member (e.g., a temperature sensor), which, while its outer diameter is substantially the same as that of the substrate P, is thicker than the substrate P, is held by a substrate stage. The distance between the front surface of such a member and the emergent surface 5 is smaller than the initial distance $E_0$, and consequently the lower surface 6 or the liquid recovery surface 30, or both, might contact the member. In such a case, too, by adjusting the positional relationship (the distance) between the lower surface 6 and the front surface of the member or the positional relationship (the distance) between the liquid contact surface (liquid recovery surface 30) and the front surface of the member, or both, in accordance with the distance between the emergent surface 5 and the front surface of the member in the Z axial directions, the lower surface 6 or the liquid recovery surface 30, or both, can be prevented from contacting (colliding with) the member. The detection system 50 can detect the position of the front surface of the member, and therefore the control apparatus 3 can move the lower surface 6 or the liquid recovery surface 30, or both, based on the detection result of that detection system 50.

In addition, if the exposure apparatus EX is an exposure apparatus that comprises a moveable substrate stage, which holds the substrate P, and a measurement stage, which does not hold the substrate to be exposed and whereon various photoelectric sensors or a fiducial member wherein a fiducial mark is formed, or both, are mounted, then the measurement stage is disposed at the exposure position, as disclosed in, for example, U.S. Pat. No. 6,897,963. In this case, the lower surface 6 or the liquid recovery surface 30, or both, can be moved in accordance with the movement conditions of the measurement stage or the supply conditions of the liquid LQ, or both.

Furthermore, when the lower surface 6 or the liquid recovery surface 30, or both, are moved in the Z axial directions, the control apparatus 3 can move—based on the measurement results of the measuring apparatus of the first drive apparatus 11 and the measuring apparatus of the second drive apparatus 12—the first member 7 or the second member 9, or both, so that the last optical element 4 and the first member 7 are prevented from contacting one another, and the first member 7 and the second member 9 are prevented from contacting one another.

Furthermore, in the embodiments discussed above, the immersion system comprises both the first drive apparatus 11 and the second drive apparatus 12, but it may comprise just one of these, as long as the relative positional relationship between the lower surface 6 of the first member 7 and the first liquid recovery surface 31 of the second member 9, namely the distance F (the size of the step 35) between the lower surface 6 and the first liquid recovery surface 31, in the Z axial directions is adjusted.

In addition, in the embodiments discussed above, a configuration is adopted wherein two members (the first member 7 and the second member 9) can be moved independently in the Z axial directions, but a configuration may be adopted wherein three or more members can be moved independently in the Z axial directions. For example, a configuration may be adopted wherein rather than providing the third liquid recovery surface 33 to the second member 9, a third member is provided that is different from the second member 9, and the first member 7, the second member 9, and the third member can be moved independently in the Z axial directions.

In addition, in each of the embodiments discussed above, a configuration may be adopted wherein the first member 7 or the second member 9, or both, can move parallel to the XY plane.

In addition, in the embodiments discussed above, "shaped annular" can also include various shapes, such as a rectangular annular shape, a circular ring shape, and a polygonal annular shape.

As explained above, the present embodiment, by preventing the liquid LQ from becoming entrained with bubbles, leaking out, or remaining behind, can prevent exposure failures from occurring. In addition, the travel speed of the substrate P can be increased while at the same time preventing exposure failures from occurring. Accordingly, satisfactory devices can be fabricated with good productivity.

Furthermore, in the embodiments discussed above, the optical path K on the emergent (image plane) side of the last optical element 4 of the projection optical system PL is filled with the liquid LQ; however, it is possible to use a projection optical system PL wherein the optical path on the incident (object plane) side of the last optical element 4 is also filled with the liquid LQ as disclosed in, for example, PCT International Publication No. WO2004/019128.

Furthermore, in each of the embodiments discussed above, water is used as the liquid LQ, but a liquid other than water may be used. For example, it is also possible to use hydrofluoro-ether (HFE), perfluorinated polyether (PFPE), Fomblin oil, or the like as the liquid LQ.

Furthermore, the substrate P in the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (synthetic quartz or a silicon wafer) that is used by an exposure apparatus.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that successively steps the substrate P and performs a full field exposure of the pattern of the mask M with the mask M and the substrate P in a stationary state.

Furthermore, when performing an exposure with a step-and-repeat system, the projection optical system PL is used to transfer a reduced image of a first pattern onto the substrate P in a state wherein the first pattern and the substrate P are substantially stationary, after which the projection optical system PL may be used to perform a full-field exposure of the substrate P, wherein a reduced image of a second pattern partially superposes the transferred first pattern in a state wherein the second pattern and the substrate P are substantially stationary (as in a stitching type full-field exposure apparatus). In addition, the stitching type exposure apparatus can also be adapted to a step-and-stitch type exposure apparatus that successively steps the substrate P and transfers at least two patterns onto the substrate P so that they are partially superposed.

In addition, the present invention can also be adapted to, for example, an exposure apparatus that combines on a substrate the patterns of two masks through a projection optical system and double exposes, substantially simultaneously, a single shot region on the substrate using a single scanning exposure, as disclosed in, for example, U.S. Pat. No. 6,611,316. In addition, the present invention can also be adapted to, for example, a proximity type exposure apparatus and a mirror projection aligner.

In addition, the present invention can also be adapted to a twin stage type exposure apparatus, which comprises a plurality of substrate stages, as disclosed in, for example, U.S. Pat. Nos. 6,341,007, 6,208,407, and 6,262,796.

The type of exposure apparatus EX is not limited to a semiconductor device fabrication exposure apparatus that exposes the substrate P with the pattern of a semiconductor device, but can also be widely adapted to exposure apparatuses that are used for fabricating, for example, liquid crystal devices or displays, and to exposure apparatuses that are used for fabricating thin film magnetic heads, image capturing devices (CCDs), micromachines, MEMS devices, DNA chips, or reticles and masks.

Furthermore, in each of the embodiments discussed above, the positions of the mask stage 1 and the substrate stage 2 are measured using an interferometer system that comprises laser interferometers, but the present invention is not limited thereto; for example, an encoder system may be used that detects a scale (diffraction grating) provided to each of the stages 1, 2. In this case, a hybrid system that comprises both the interferometer system and the encoder system may also be adopted.

In addition, in each of the embodiments discussed above, an ArF excimer laser may be used as a light source apparatus that generates ArF excimer laser light, which serves as the exposure light EL; however, as disclosed in, for example, U.S. Pat. No. 7,023,610, a harmonic generation apparatus may be used that outputs pulsed light with a wavelength of 193 nm and that comprises: an optical amplifier part, which has a solid state laser light source (such as a DFB semiconductor laser or a fiber laser), a fiber amplifier, and the like; and a wavelength converting part. Moreover, in the abovementioned embodiments, both the illumination region IR and the projection region PR are rectangular, but they may be some other shape, for example, arcuate.

Furthermore, in each of the embodiments discussed above, an optically transmissive mask is used wherein a prescribed shielding pattern (or phase pattern or dimming pattern) is formed on an optically transmissive substrate; however, instead of such a mask, a variable pattern forming mask (also called an electronic mask, an active mask, or an image generator), wherein a transmissive pattern, a reflective pattern, or a light emitting pattern is formed based on electronic data of the pattern to be exposed, may be used as disclosed in, for example, U.S. Pat. No. 6,778,257. The variable pattern forming mask comprises a digital micromirror device (DMD), which is one kind of a non-emissive type image display device (spatial light modulator). In addition, instead of a variable pattern forming mask that comprises a non-emissive type image display device, a pattern forming apparatus that comprises a self luminous type image display device may be provided. Examples of a self luminous type image display device include a cathode ray tube (CRT), an inorganic electroluminescence display, an organic electroluminescence display (OLED: organic light emitting diode), an LED display, a laser diode (LD) display, a field emission display (FED), and a plasma display panel (PDP).

Each of the embodiments discussed above explained an exemplary case of an exposure apparatus that comprises the projection optical system PL, but the present invention can be adapted to an exposure apparatus and an exposing method that do not use the projection optical system PL. Thus, even if the projection optical system PL is not used, the exposure light can be radiated to the substrate P through optical members, such as lenses, and an immersion space can be formed in a prescribed space between the substrate P and those optical members.

In addition, by forming interference fringes on the substrate P as disclosed in, for example, PCT International Publication No. WO2001/035168, the present invention can also be adapted to an exposure apparatus (a lithographic system) that exposes the substrate P with a line-and-space pattern.

As described above, the exposure apparatus EX of the present embodiment is manufactured by assembling various subsystems, as well as each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 11:
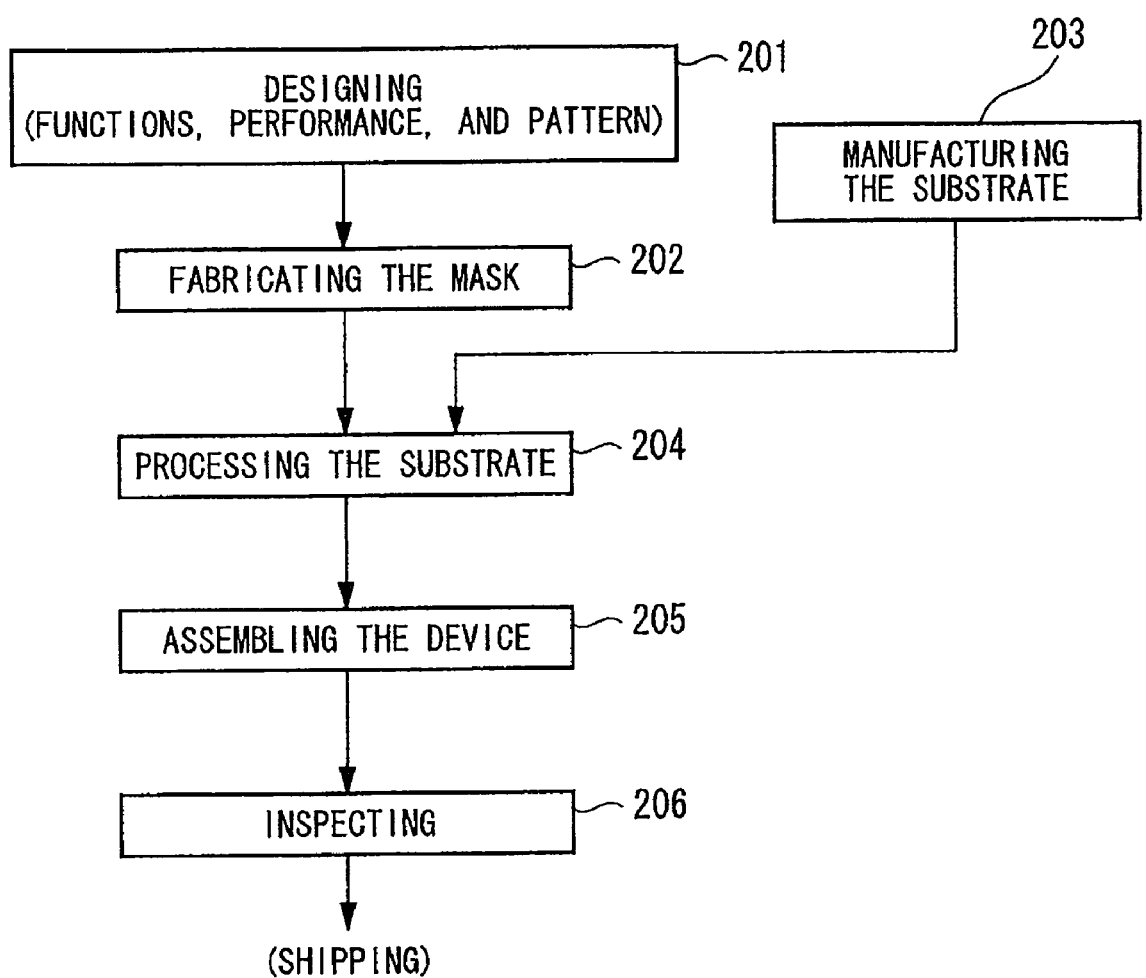
FIG. 11 is a flow chart that depicts one example of a process of fabricating a microdevice.

As shown in FIG. 11, a micro-device, such as a semiconductor device, is manufactured by: a step 201 that designs the functions and performance of the micro-device; a step 202 that fabricates a mask (a reticle) based on this designing step; a step 203 that manufactures a substrate, which is the base material of the device; a substrate processing step 204 that comprises a substrate process (exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

Furthermore, the features of each of the embodiments discussed above can be appropriately combined. There can also be cases wherein some of the constituent elements are not used. In addition, each disclosure of every patent publication and U.S. patent related to the exposure apparatus recited in each of the embodiments, modified examples, and the like discussed above is hereby incorporated by reference in its entirety to the extent permitted by the national laws and regulations designated by the present application.

What is claimed is:

1. An immersion system used in an immersion exposure, comprising:
    a first member, which is disposed around an optical path of exposure light and has a first surface that faces in a first direction, the optical path between an optical member and a substrate being filled with a liquid, a space between the first surface and a front surface of an object being capable of holding a liquid;
    a second member that has a liquid recovery port, which is disposed on the outer side of the first surface with respect to the optical path of the exposure light, at least part of a liquid between the liquid recovery port and the front surface of the object being recovered via the liquid recovery port;
    a first drive apparatus that is capable of moving the first member in at least the first direction; and
    a second drive apparatus that is capable of moving the second member in at least the first direction independently of the first member.

2. An immersion system according to claim 1, wherein
at least one of: a positional relationship between the front surface of the object and the first surface in the first direction; and a positional relationship between the front surface of the object and the liquid recovery port in the first direction is adjusted in accordance with a movement condition of the object.

3. An immersion system according to claim 2, wherein
the first surface and the liquid recovery port are moved relative to one another in accordance with the movement condition of the object.

4. An immersion system according to claim 2 wherein
the movement condition includes a movement velocity of the object in a direction substantially parallel to the first surface.

5. An immersion system according to claim 2, wherein
the movement condition includes a linear distance of continuous movement of the object in a direction substantially parallel to the first surface.

6. An immersion system according to claim 1, wherein
during the movement of the object in a direction substantially parallel to the first surface, at least one of the first surface and the liquid recovery port is moved in the first direction.

7. An immersion system according to claim 1, wherein
at least one of: a positional relationship between the front surface of the object and the first surface in the first direction; and a positional relationship between the front surface of the object and the liquid recovery port in the first direction is adjusted in accordance with a supply condition of the liquid.

8. An immersion system according to claim 7, wherein
the supply condition includes an amount of liquid supplied per unit of time.

9. An immersion system according to claim 1, wherein
at least one of: a positional relationship between the front surface of the object and the first surface in a direction parallel to the first direction; and a positional relationship between the front surface of the object and the liquid recovery port in the first direction is adjusted in accordance with a distance between the emergent surface of the optical member and the front surface of the object in the first direction.

10. An immersion system according to claim 1, wherein
a distance between the emergent surface and the first surface in the first direction is different from a distance between the emergent surface and the liquid recovery port in the direction parallel to the first direction.

11. An immersion system according to claim 10, wherein
at least one of: a position of the first surface in the first direction; and a position of the liquid recovery port in the first direction is adjusted so that a distance between the front surface of the object and the liquid recovery port is greater than the distance between the front surface of the object and the first surface.

12. An immersion system according to claim 1, wherein
the liquid recovery port includes a first liquid recovery area and a second liquid recovery area, which is disposed on the outer side of the first surface with respect to the optical path of the exposure light.

13. An immersion system according to claim 12, wherein
at least one of the first liquid recovery area and the second liquid recovery area includes a front surface of a porous member, and
at least part of the liquid between the liquid recovery port and the object is recovered via the porous member.

14. An immersion system according to claim 12 wherein
the first liquid recovery area faces in the first direction, and at least part of the second liquid recovery area faces in a direction other than the first direction.

15. An exposure apparatus according to claim 1, wherein
the first member has a liquid supply port that supplies the liquid to the optical path, and
the liquid supply port faces in a direction other than the first direction.

16. An immersion system according to claim 1, wherein
the first member is disposed around the optical path.

17. An immersion system according to claim 1, wherein
the second member is disposed around the optical path.

18. An immersion system according to claim 17, wherein
the liquid recovery port is disposed around the optical path.

19. An immersion system according to claim 1, wherein
the object includes the substrate.

20. An immersion system used in an immersion exposure, comprising:
    a first member, which is disposed around an optical path of exposure light and has a first surface that faces in a first direction, the optical path between an optical member and a substrate being filled with a liquid, a space between the first surface and a front surface of an object being capable of holding a liquid;

a second member that has a liquid recovery port, which is disposed on the outer side of the first surface with respect to the optical path of the exposure light, at least part of a liquid between the liquid recovery port and the front surface of the object being recovered via the liquid recovery port; and a drive apparatus that is capable of controlling a relative movement between a first member and a second member in at least the first direction;

wherein, the liquid recovery port has a first recovery area and a second recovery area, which is disposed on the outer side of the first surface with respect to the optical path of the exposure light, a distance between a front surface of the object and the first recovery area in the first direction is greater than a distance between the front surface of the object and the second recovery area in the first direction, and a positional relationship between the first recovery area and the first surface in the first direction can be adjusted.

21. An immersion system according to claim 20, wherein at least one of the first liquid recovery area and the second liquid recovery area includes a front surface of a porous member, and at least part of the liquid between the liquid recovery port and the object is recovered via the porous member.

22. An immersion system according to claim 20 wherein the first liquid recovery area faces in the first direction, and at least part of the second liquid recovery area faces in a direction other than the first direction.

23. An immersion system according to claim 20 wherein the first liquid recovery area and at least part of the second liquid recovery area are substantially parallel.

24. An exposure apparatus that exposes a substrate with exposure light through a liquid, comprising:

an immersion system according to claim 1.

25. A device fabricating method, comprising:

exposing a substrate using an exposure apparatus according to claim 24; and developing the exposed substrate.

26. An exposing method that exposes a substrate with exposure light through a liquid, the method comprising:

filling an optical path of the exposure light between the optical member and the substrate with the liquid using an immersion system according to claim 1; and radiating the exposure light to the substrate through the optical member and the liquid.

27. A device fabricating method, comprising:

exposing a substrate using an exposing method according to claim 26; and developing the exposed substrate.

* * * * *